(12) United States Patent
Kumazaki

(10) Patent No.: US 11,862,293 B2
(45) Date of Patent: Jan. 2, 2024

(54) SEMICONDUCTOR MEMORY DEVICE FOR REDUCING EFFECT OF LEAKAGE CURRENT

(71) Applicant: KIOXIA CORPORATION, Tokyo (JP)

(72) Inventor: Noriyasu Kumazaki, Kawasaki (JP)

(73) Assignee: KIOXIA CORPORATION, Tokyo (JP)

( * ) Notice: Subject to any disclaimer, the term of this patent is extended or adjusted under 35 U.S.C. 154(b) by 63 days.

(21) Appl. No.: 17/643,499

(22) Filed: Dec. 9, 2021

(65) Prior Publication Data

US 2022/0406351 A1    Dec. 22, 2022

(30) Foreign Application Priority Data

Jun. 21, 2021    (JP) ................................ 2021-102806

(51) Int. Cl.
*G11C 8/14*    (2006.01)
*G11C 8/08*    (2006.01)

(52) U.S. Cl.
CPC . *G11C 8/14* (2013.01); *G11C 8/08* (2013.01)

(58) Field of Classification Search
CPC .. G11C 8/14; G11C 8/08; G11C 16/32; G11C 5/063; G11C 8/12; G11C 16/16; G11C 16/26; G11C 16/10; G11C 16/30
See application file for complete search history.

(56) References Cited

U.S. PATENT DOCUMENTS

| | | | |
|---|---|---|---|
| 8,085,585 B2 * | 12/2011 | Nagashima | G11C 8/14 365/163 |
| 9,910,594 B2 | 3/2018 | Rajwade et al. | |
| 10,600,488 B2 | 3/2020 | Song et al. | |
| 2018/0040378 A1 * | 2/2018 | Lee | G11C 8/12 |
| 2018/0082744 A1 * | 3/2018 | Park | G11C 8/14 |
| 2018/0261267 A1 * | 9/2018 | Shimura | G11C 16/32 |
| 2019/0371382 A1 * | 12/2019 | Futatsuyama | G11C 8/08 |
| 2020/0202937 A1 | 6/2020 | Bushnaq et al. | |
| 2020/0303017 A1 | 9/2020 | Yamaoka | |
| 2021/0241837 A1 * | 8/2021 | Date | H10B 41/10 |
| 2022/0157389 A1 * | 5/2022 | Utsumi | H10B 41/10 |

FOREIGN PATENT DOCUMENTS

| | | |
|---|---|---|
| JP | 2019-169234 A | 10/2019 |
| JP | 2020-102282 A | 7/2020 |
| JP | 2020-155184 A | 9/2020 |

* cited by examiner

*Primary Examiner* — Khamdan N. Alrobaie
(74) *Attorney, Agent, or Firm* — Oblon, McClelland, Maier & Neustadt, L.L.P.

(57) ABSTRACT

A semiconductor memory device includes memory cell arrays including a first memory cell and a first word line connected to the first memory cell, a first wiring electrically connected to the first word lines corresponding to the memory cell arrays, a driver circuit electrically connected to the first wiring, second wirings electrically connected to the first wiring via the driver circuit, a voltage generation circuit including output terminals disposed corresponding to the second wirings, and first circuits disposed corresponding to the memory cell arrays. The voltage generation circuit is electrically connected to the first word lines via a first current path including the second wirings, the driver circuit, and the first wiring. The voltage generation circuit is electrically connected to the first word lines via a second current path including the second wirings and the first circuits and without including the driver circuit.

20 Claims, 29 Drawing Sheets

SEMICONDUCTOR MEMORY DEVICE FOR REDUCING EFFECT OF LEAKAGE CURRENT

CROSS-REFERENCE TO RELATED APPLICATIONS

This application is based upon and claims the benefit of Japanese Patent Application No. 2021-102806, filed on Jun. 21, 2021, the entire contents of which are incorporated herein by reference.

BACKGROUND

Field

Embodiments described herein relate generally to a semiconductor memory device.

Description of the Related Art

There has been known a semiconductor memory device including a plurality of memory cell arrays including a first memory cell and a first word line connected to the first memory cell and a voltage generation circuit electrically connected to a plurality of the first word lines corresponding to these plurality of memory cell arrays.

DETAILED DESCRIPTION

Figure 1:
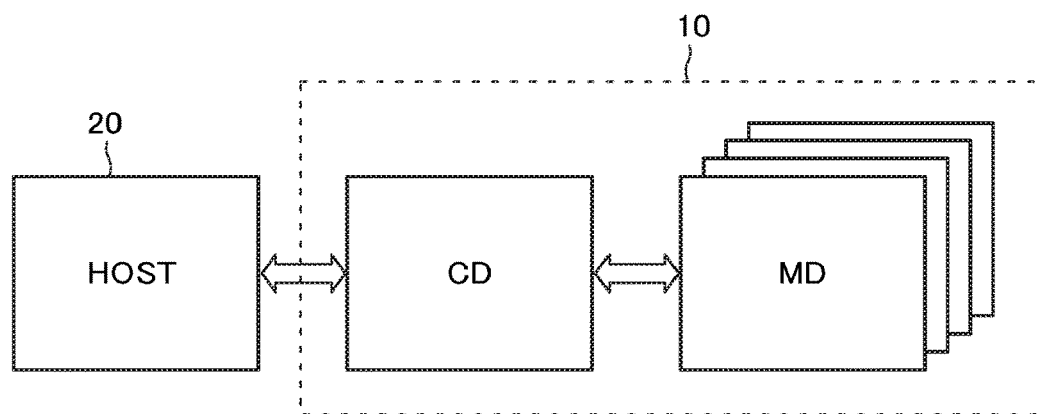
FIG. 1 is a schematic block diagram illustrating a configuration of a memory system 10 according to a first embodiment.

A semiconductor memory device according to one embodiment comprises a plurality of memory cell arrays including a first memory cell and a first word line connected to the first memory cell, a first wiring electrically connected to the plurality of first word lines corresponding to the plurality of memory cell arrays, a driver circuit electrically connected to the first wiring, a plurality of second wirings electrically connected to the first wiring via the driver circuit, a voltage generation circuit including a plurality of output terminals disposed corresponding to the plurality of second wirings, and a plurality of first circuits disposed corresponding to the plurality of memory cell arrays. The voltage generation circuit is electrically connected to the plurality of first word lines via a first current path including the plurality of second wirings, the driver circuit, and the first wiring. The voltage generation circuit is electrically connected to the plurality of first word lines via a second current path including the plurality of second wirings and the plurality of first circuits and without including the driver circuit.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Memory System 10]

FIG. 1 is a schematic block diagram illustrating a configuration of a memory system 10 according to a first embodiment.

The memory system 10, for example, reads, writes, and erases user data according to a signal transmitted from a host computer 20. The memory system 10 is, for example, any system that can store the user data including a memory chip, a memory card, and an SSD. The memory system 10 includes a plurality of memory dies MD that store the user data and a controller die CD connected to these plurality of memory dies MD and the host computer 20. The controller die CD includes, for example, a processor, a RAM, and the like, and performs a process, such as conversion between a logical address and a physical address, bit error detection/correction, a garbage collection (compaction), and a wear leveling.

Figure 2:
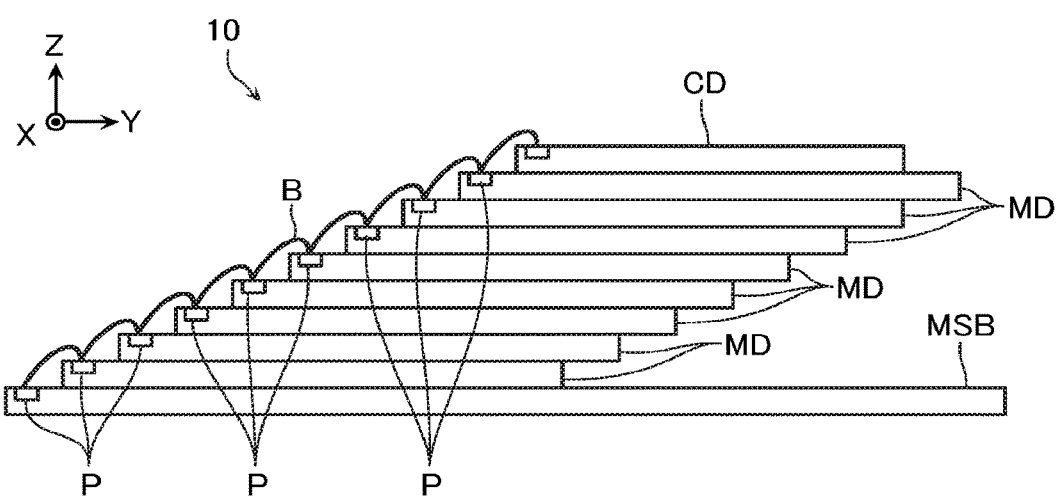
FIG. 2 is a schematic side view illustrating an exemplary configuration of the memory system 10 according to the embodiment.
Figure 3:
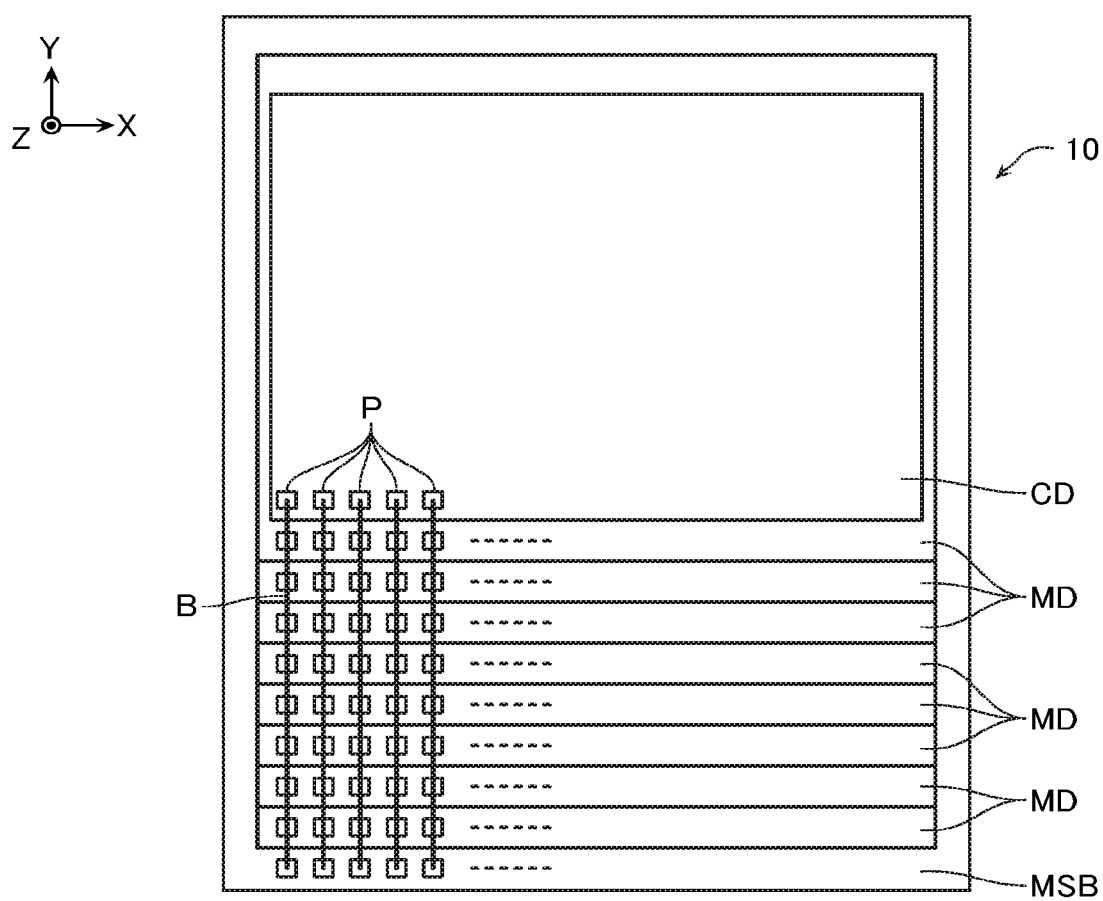
FIG. 3 is a schematic plan view illustrating the exemplary configuration.

FIG. 2 is a schematic side view illustrating an exemplary configuration of the memory system 10 according to the embodiment. FIG. 3 is a schematic plan view illustrating the exemplary configuration. For convenience of description, FIG. 2 and FIG. 3 omit a part of a configuration.

As illustrated in FIG. 2, the memory system 10 according to the embodiment includes a mounting substrate MSB, the plurality of memory dies MD stacked on the mounting substrate MSB, and the controller die CD stacked on the memory dies MD. On an upper surface of the mounting substrate MSB, a pad electrode P is disposed in a region at an end portion in the Y-direction, and a part of the other region is bonded to a lower surface of the memory die MD via an adhesive and the like. On an upper surface of the memory die MD, the pad electrode P is disposed in a region at an end portion in the Y-direction, and the other region is bonded to a lower surface of another memory die MD or the controller die CD via the adhesive and the like. On an upper surface of the controller die CD, the pad electrode P is disposed in a region at an end portion in the Y-direction.

As illustrated in FIG. 3, the mounting substrate MSB, the plurality of memory dies MD, and the controller die CD include a plurality of the respective pad electrodes P arranged in an X-direction. The plurality of pad electrodes P disposed in the mounting substrate MSB, the plurality of memory dies MD, and the controller die CD are each mutually connected via bonding wires B.

Note that the configuration illustrated in FIG. 2 and FIG. 3 is merely an example, and the specific configuration is appropriately adjustable. For example, in the example illustrated in FIG. 2 and FIG. 3, the controller die CD is stacked on the plurality of memory dies MD, and these configurations are connected with the bonding wires B. In such a configuration, the plurality of memory dies MD and the controller die CD are included in one package. However, the controller die CD may be included in a package different from that of the memory dies MD. Additionally, the plurality of memory dies MD and the controller die CD may be connected to one another via through electrodes or the like, not via the bonding wires B.

[Circuit Configuration of Memory Die MD]

Figure 4:
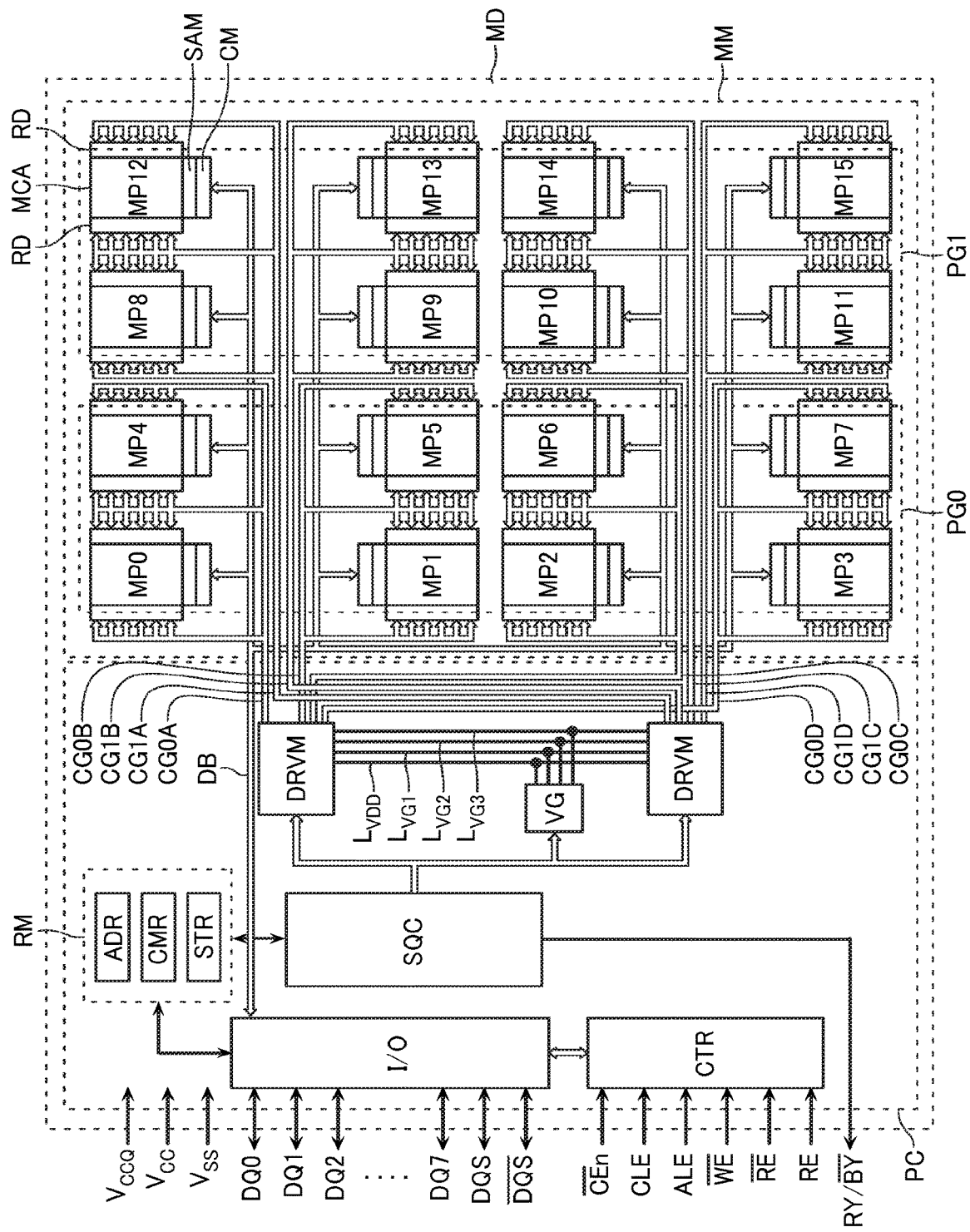
FIG. 4 is a schematic block diagram illustrating a configuration of a memory die MD.
Figure 5:
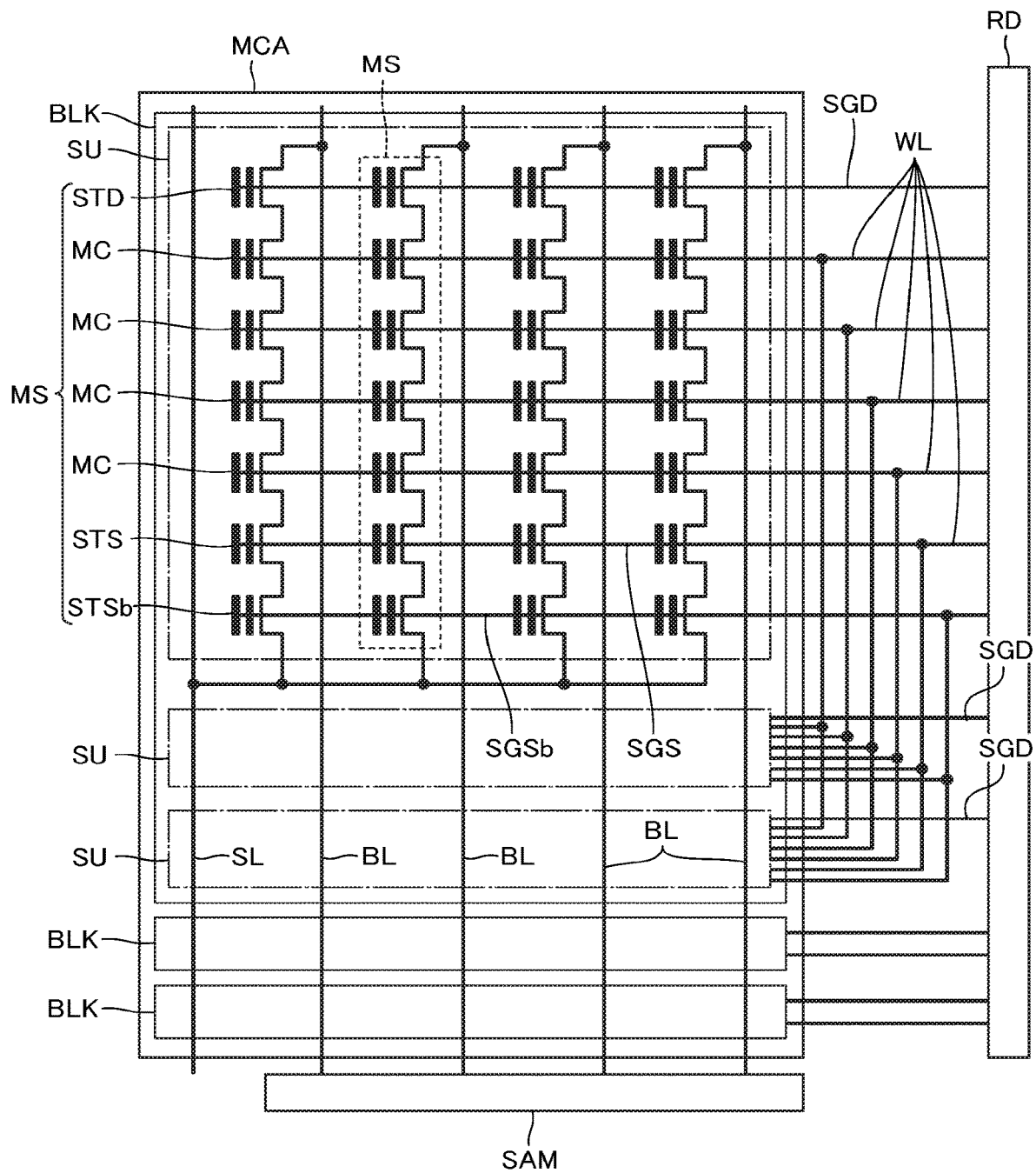
FIG. 5 is a schematic circuit diagram illustrating a configuration of a part of the memory die MD.
Figure 6:
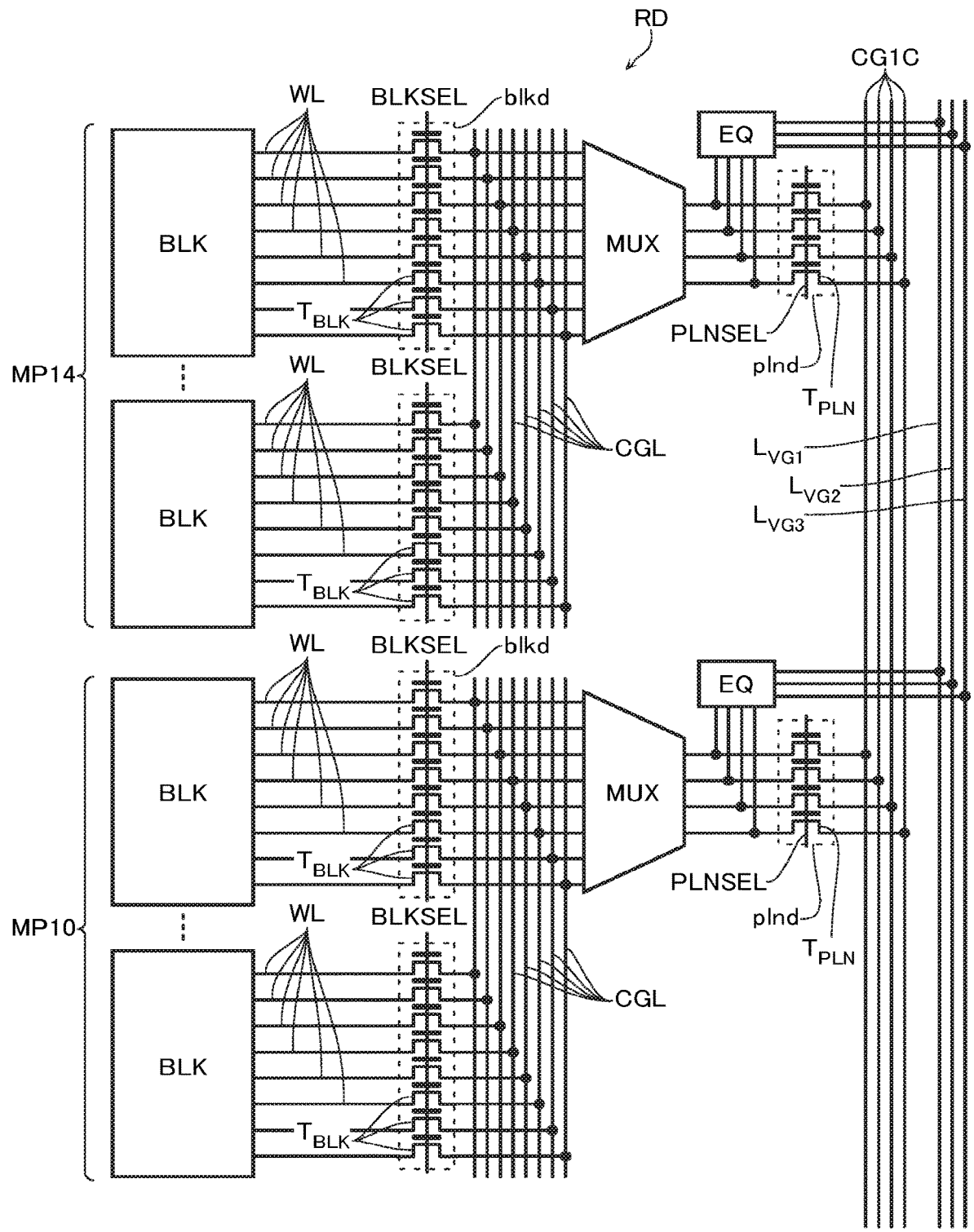
FIG. 6 is a schematic circuit diagram illustrating a configuration of a part of the memory die MD.
Figure 7:
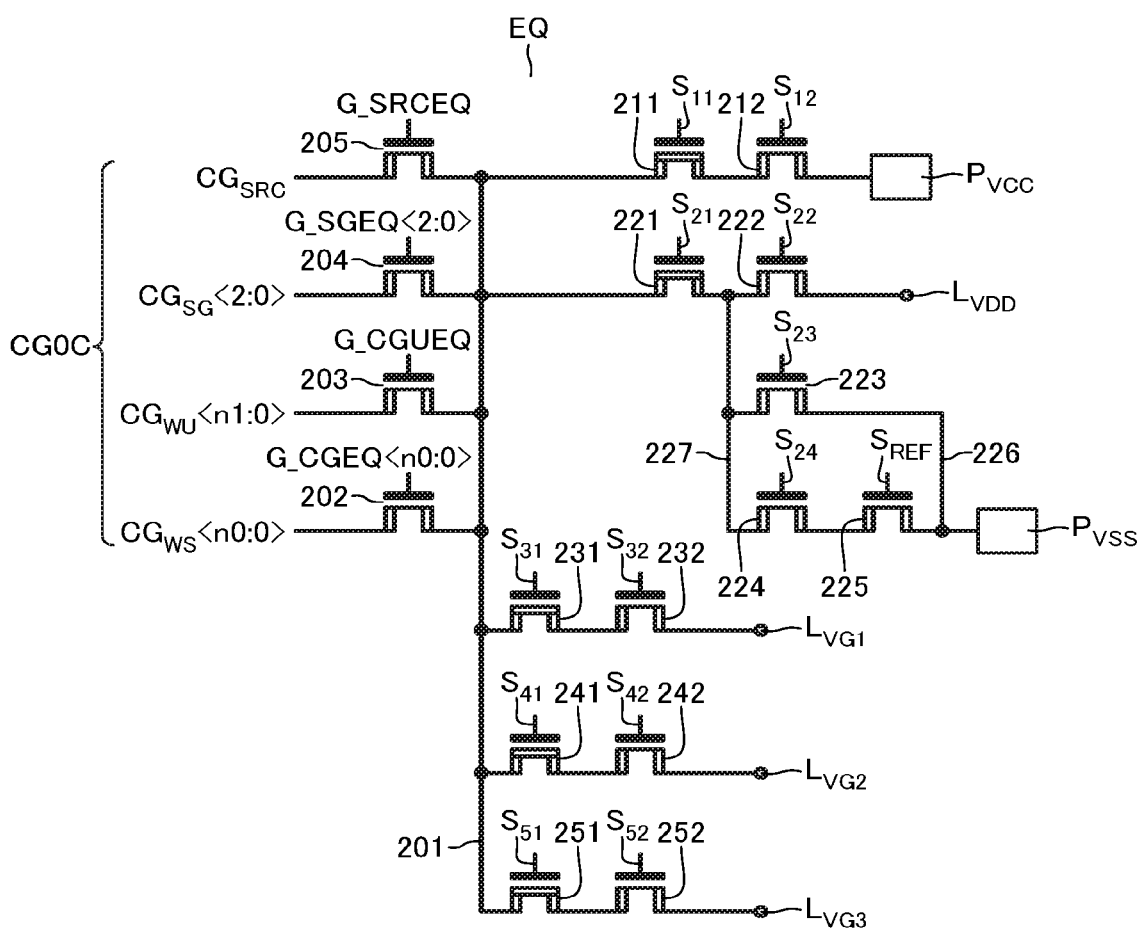
FIG. 7 is a schematic circuit diagram illustrating a configuration of a part of the memory die MD.

FIG. 4 is a schematic block diagram illustrating a configuration of the memory die MD according to the first embodiment. FIG. 5 to FIG. 7 are schematic circuit diagrams illustrating a configuration of a part of the memory die MD.

Note that FIG. 4 illustrates a plurality of control terminals and the like. These plurality of control terminals may be expressed as control terminals corresponding to high active signals (positive logic signals), may be expressed as control terminals corresponding to low active signals (negative logic signals), or may be expressed as control terminals corresponding to both the high active signals and the low active signals. In FIG. 4, reference numerals of the control terminals corresponding to the low active signals include an overline. In this specification, reference numerals of the control terminals corresponding to the low active signals include a slash ("/"). Note that the illustration in FIG. 4 is an example, and the specific aspect is appropriately adjustable. For example, it is possible to change a part or all of the high active signals to low active signals or change a part or all of the low active signals to high active signals.

[Circuit Configuration]

As illustrated in FIG. 4, the memory die MD includes a memory module MM and a peripheral circuit PC.

[Circuit Configuration of Memory Module MM]

The memory module MM includes plane groups PG0 and PG1. The plane group PG0 includes a memory plane MP0 to a memory plane MP7. The plane group PG1 includes a memory plane MP8 to a memory plane MP15. The memory plane MP0 to the memory plane MP15 each include a memory cell array MCA, row decoders RD, a sense amplifier module SAM, and a cache memory CM.

[Circuit Configuration of Memory Cell Array MCA]

The memory cell array MCA includes a plurality of memory blocks BLK as illustrated in FIG. 5. The plurality of memory blocks BLK each include a plurality of string units SU. These plurality of string units SU each include a plurality of memory strings MS. These plurality of memory strings MS have one ends each connected to the sense amplifier module SAM via bit lines BL. These plurality of memory strings MS have other ends each connected to a source line driver (not illustrated) via a common source line SL.

The memory string MS includes a drain-side select transistor STD, a plurality of memory cells MC (memory transistors), a source-side select transistor STS, and a source-side select transistor STSb, which are connected in series between the bit line BL and the source line SL. Hereinafter, the drain-side select transistor STD, the source-side select transistor STS, and the source-side select transistor STSb may be simply referred to as select transistors (STD, STS, STSb).

The memory cell MC is a field-effect type transistor including a semiconductor layer that functions as a channel region, a gate insulating film including an electric charge accumulating film, and a gate electrode. The memory cell MC has a threshold voltage that changes according to an electric charge amount in the electric charge accumulating film. The memory cell MC stores one bit or a plurality of bits of data. Word lines WL are connected to the plurality of respective memory cells MC corresponding to one memory string MS. These respective word lines WL function as gate electrodes of the memory cells MC included in all of the memory strings MS in one memory block BLK.

The select transistors (STD, STS, STSb) are field-effect type transistors including a semiconductor layer that functions as a channel region, a gate insulating film, and a gate electrode. Select gate lines (SGD, SGS, SGSb) are connected to the respective gate electrodes of the select transistors (STD, STS, STSb). The drain-side select gate line SGD is disposed corresponding to the string unit SU and functions as the gate electrode of the drain-side select transistor STD included in all of the memory strings MS in one string unit SU. The source-side select gate line SGS functions as the gate electrode of the source-side select transistor STS included in all of the memory strings MS in the memory block BLK. The source-side select gate line SGSb functions as the gate electrodes of the source-side select transistors STSb included in all of the memory strings MS in the memory block BLK.

[Circuit Configuration of Row Decoder RD]

The row decoder RD, for example, as illustrated in FIG. 6, includes a plurality of block decode units blkd, a multiplexer MUX, a plane decode unit plnd, and an equalizer EQ.

The block decode units blkd are disposed corresponding to the plurality of memory blocks BLK in the memory cell array MCA. The block decode unit blkd includes a plurality of transistors $T_{BLK}$. These plurality of transistors $T_{BLK}$ are disposed corresponding to the plurality of word lines WL and the select gate lines (SGD, SGS, SGSb) in the memory block BLK. The transistor $T_{BLK}$ is, for example, a field-effect type NMOS transistor.

The transistor $T_{BLK}$ has a drain electrode connected to the word line WL or the select gate line (SGD, SGS, SGSb). The transistor $T_{BLK}$ has a source electrode connected to a wiring CGL. The wiring CGL is electrically connected to all the memory blocks BLK included in the memory cell array MCA. The transistor $T_{BLK}$ has a gate electrode connected to a signal supply line BLKSEL. A plurality of the signal supply lines BLKSEL are disposed corresponding to the block decode unit blkd. The signal supply line BLKSEL is connected to all the transistors $T_{BLK}$ in the block decode unit blkd.

The multiplexer MUX has output terminals connected to the respective wirings CGL. The multiplexer MUX has input terminals electrically connected to respective wirings CG (wirings CG1C in the example in FIG. 6). The number of the wirings CG is less than the number of the wirings CGL. The multiplexer MUX electrically conducts each of the wirings CG to one or a plurality of the wirings CGL according to an input address signal and a control signal from a sequencer SQC.

Note that, for example, as illustrated in FIG. 4, the memory die MD may include wirings CG0A, CG1A, CG0B, CG1B, CG0C, CG1C, CG0D, CG1D as the wirings CG. The wiring CG0A may be electrically connected to all the memory blocks BLK included in the memory planes MP0, MP4 (FIG. 4). The wiring CG1A may be electrically connected to all the memory blocks BLK included in the memory planes MP8, MP12. The wiring CG1B (FIG. 4) may be electrically connected to all the memory blocks BLK included in the memory planes MP9, MP13. The wiring CG0B may be electrically connected to all the memory blocks BLK included in the memory planes MP1, MP5. The wiring CG0C may be electrically connected to all the memory blocks BLK included in the memory planes MP2, MP6. The wiring CG1C may be electrically connected to all the memory blocks BLK included in the memory planes MP10, MP14. The wiring CG1D may be electrically connected to all the memory blocks BLK included in the memory planes MP11, MP15. The wiring CG0D may be electrically connected to all the memory blocks BLK included in the memory planes MP3, MP7.

The wiring CG may include, for example, as exemplarily illustrated in FIG. 7, n0 (n0 is a positive integer)+1 wirings $CG_{WS}$, n1 (n1 is a positive integer)+1 wirings $CG_{WU}$, three wirings $CG_{SG}$, and one wiring $CG_{SRC}$. The wiring $CG_{WS}$ may, for example, be electrically conducted to the wiring CGL electrically conductive to a selected word line $WL_S$ or a wiring CGL in its vicinity in a read operation and a write operation. The wiring $CG_{WU}$ may, for example, be electrically conducted to n0+1 unselected word lines $WL_U$ in the read operation and the write operation. The wiring $CG_{WS}$ and the wiring $CG_{WU}$ may, for example, be electrically conducted to the wiring CGL electrically conductive to the word line WL in an erase operation. The wiring $CG_{SG}$ may, for example, be electrically conducted to the drain-side select gate line SGD corresponding to the selected memory cell MC, a plurality of the drain-side select gate lines SGD not corresponding to the selected memory cell MC, or the source-side select gate lines SGS, SGSb in the read operation, the write operation, and the erase operation. The wiring $CG_{SRC}$ may, for example, be electrically conducted to the source line SL in the read operation, the write operation, and the erase operation.

The plane decode unit plnd (FIG. 6) is disposed corresponding to the memory cell array MCA. The plane decode unit plnd includes a plurality of transistors $T_{PLN}$. These plurality of transistors $T_{PLN}$ are disposed corresponding to the wirings CG (the wirings CG1C in the example in FIG. 6). The transistor $T_{PLN}$ is, for example, a field-effect type NMOS transistor.

The transistor $T_{PLN}$ has a drain electrode connected to the input terminal of the multiplexer MUX. The transistor $T_{PLN}$ has a source electrode connected to the wiring CG (the wirings CG1C in the example in FIG. 6). The transistor $T_{PLN}$ has a gate electrode connected to a signal supply line PLNSEL. A plurality of the signal supply lines PLNSEL are disposed corresponding to the plane decode unit plnd. The signal supply line PLNSEL is connected to all the transistors $T_{PLN}$ in the plane decode unit plnd.

The equalizer EQ includes, for example, as illustrated in FIG. 7, a node 201 and a plurality of transistors 202 to 205, 211, 212, 221 to 225, 231, 232, 241, 242, 251, 252 electrically connected to the node 201. The plurality of transistors 202 to 205, 211, 212, 221 to 225, 231, 232, 241, 242, 251, 252 are, for example, field-effect type NMOS transistors. For example, these transistors 202 to 205, 212, 222 to 225, 232, 242, 252 may be, for example, enhancement type transistors. For example, the transistors 211, 221, 231, 241, 251 may be, for example, depletion type transistors.

Corresponding to n0+1 wirings $CG_{WS}$, n0+1 transistors 202 are disposed. The transistors 202 have drain electrodes connected to the respective wirings $CG_{WS}$. The transistors 202 have source electrodes commonly connected to the node 201. The transistors 202 have gate electrodes each connected to any one of n0+1 signal lines G_CGEQ. These n0+1 signal lines G_CGEQ are electrically independent from one another.

Corresponding to n1+1 wirings $CG_{WU}$, n1+1 transistors 203 are disposed. The transistors 203 have drain electrodes connected to the respective wirings $CG_{WU}$. The transistors 203 have source electrodes commonly connected to the node 201. The transistors 203 have gate electrodes commonly connected to one signal line G_CGUEQ.

Corresponding to three wirings $CG_{SG}$, three transistors 204 are disposed. The transistors 204 have drain electrodes connected to the respective wirings $CG_{SG}$. The transistors 204 have source electrodes commonly connected to the node 201. The transistor 204 have gate electrodes each connected to any one of three signal lines GSGEQ. These three signal lines G_SGEQ are electrically independent from one another.

Corresponding to one wiring $CG_{SRC}$, one transistor 205 is disposed. The transistor 205 has a drain electrode connected to the wiring $CG_{SRC}$. The transistor 205 has a source electrode connected to the node 201. The transistor 205 has a gate electrode connected to the signal line G_SRCEQ.

The transistors 211, 212 are disposed in a current path between the node 201 and a pad electrode $P_{VCC}$ The pad electrodes $P_{VCC}$ are parts of the plurality of pad electrodes P described with reference to FIG. 2 and FIG. 3. The pad electrode $P_{VCC}$ is applied with a power supply voltage $V_{CC}$. The transistors 211, 212 have gate electrodes connected to respective signal lines $S_{11}$, $S_{12}$.

The transistors 221, 222 are disposed in a current path between the node 201 and a voltage supply line $L_{VDD}$ The transistors 221, 222 have gate electrodes connected to respective signal lines $S_{21}$, $S_{22}$.

The transistors 221, 223 are disposed in a current path 226 between the node 201 and a pad electrode $P_{VSS}$. The current path 226 does not include the transistors 224, 225. The transistors 221, 224, 225 are disposed in a current path 227 between the node 201 and the pad electrode $P_{VSS}$. The current path 227 does not include the transistor 223. The pad electrodes $P_{VSS}$ are parts of the plurality of pad electrodes P described with reference to FIG. 2 and FIG. 3. The pad electrode $P_{VSS}$ is applied with a ground voltage $V_{SS}$ (a power supply voltage). The transistors 223, 224, 225 have gate electrodes connected to respective signal lines $S_{23}$, $S_{24}$, $S_{REF}$.

The transistors 231, 232 are disposed in a current path between the node 201 and a voltage supply line $L_{VG1}$. The transistors 231, 232 have gate electrodes connected to respective signal lines $S_{31}$, $S_{32}$.

The transistors 241, 242 are disposed in a current path between the node 201 and a voltage supply line $L_{VG2}$. The transistors 241, 242 have gate electrodes connected to respective signal lines $S_{41}$, $S_{42}$.

The transistors 251, 252 are disposed in a current path between the node 201 and a voltage supply line $L_{VG3}$. The transistors 251, 252 have gate electrodes connected to respective signal lines $S_{51}$, $S_{52}$.

[Circuit Configuration of Sense Amplifier Module SAM]

The sense amplifier module SAM (FIG. 4) includes, for example, a plurality of sense amplifier units corresponding to the plurality of bit lines BL (FIG. 5). The sense amplifier units each include a sense circuit connected to the bit line BL, a voltage transfer circuit connected to the bit line BL, and a latch circuit connected to the sense circuit and the voltage transfer circuit. The sense circuit includes a sense transistor that enters an ON state according to the voltage or the current of the bit line BL, and a wiring charged or discharged according to the ON/OFF state of the sense transistor. The latch circuit latches data of "1" or "0" according to the voltage of this wiring. The voltage transfer circuit electrically conducts the bit line BL with any of two voltage supply lines according to the data latched by this latch circuit . The sense amplifier modules SAM are each connected to the sequencer SQC.

[Circuit Configuration of Cache Memory CM]

The cache memory CM (FIG. 4) includes a plurality of latch circuits connected to the latch circuit in the sense amplifier module SAM. Data included in these plurality of latch circuits are sequentially transferred to the sense amplifier module SAM or an input/output control circuit I/O.

The cache memory CM is connected to a decode circuit and a switch circuit (not illustrated). The decode circuit decodes a column address latched by an address register ADR. The switch circuit electrically conducts the latch circuit corresponding to the column address with a bus DB according to an output signal of the decode circuit.

[Circuit Configuration of Peripheral Circuit PC]

The peripheral circuit PC includes, for example, as illustrated in FIG. 4, a driver module DRVM, a voltage generation circuit VG, and the sequencer SQC. The peripheral circuit PC includes a register module RM. The peripheral circuit PC includes the input/output control circuit I/O and a logic circuit CTR.

The driver module DRVM may include, for example, eight driver units disposed corresponding to the wirings CG0A, CG1A, CG0B, CG1B, CG0C, CG1C, CG0D, CG1D . These eight driver units electrically conducts the wiring CG with any one of the voltage supply lines corresponding to, for example, the input address signal and the control signal from the sequencer SQC. Note that, in FIG. 4, the voltage supply lines $L_{VDD}$, $L_{VG1}$, $L_{VG2}$, $L_{VG3}$ are exemplarily illustrated as the voltage supply lines.

The voltage generation circuit VG includes, for example, a plurality of voltage generation units. The voltage generation unit, for example, generates a voltage of a predetermined magnitude in the read operation, the write operation, and the erase operation, and outputs the voltage via the voltage supply lines $L_{VDD}$, $L_{VG1}$, $L_{VG2}$, $L_{VG3}$. The voltage generation unit may be, for example, a step-up circuit, such as a charge pump circuit or a step-down circuit, such as a regulator. These step-down circuit and step-up circuit are connected to the respective voltage supply lines to which the power supply voltage $V_{CC}$ and the ground voltage $V_{SS}$ are applied. These voltage supply lines are, for example, connected to the pad electrodes P described with reference to FIG. 2 and FIG. 3.

The sequencer SQC outputs an internal control signal to the memory module MM, the driver module DRVM, and the voltage generation circuit VG according to command data latched by a command register CMR. The sequencer SQC outputs status data appropriately indicating its own state to a status register STR.

The sequencer SQC generates a ready/busy signal and outputs the ready/busy signal to a terminal RY//BY. During a period where the terminal RY//BY is in an "L" state (a busy period), access to the memory die MD is basically inhibited. During a period where the terminal RY//BY is in an "H" state (a ready period), access to the memory die MD is permitted. Note that the terminal RY//BY is, for example, achieved by the pad electrode P described with reference to FIG. 2 and FIG. 3.

The register module RM includes, for example, the address register ADR that latches address data, the command register CMR that latches command data, and the status register STR that latches status data.

The input/output control circuit I/O includes data input/output terminals DQ0 to DQ7, toggle signal input/output terminals DQS,/DQS, and an input circuit, such as a comparator connected to the data input/output terminals DQ0 to DQ7, and an output circuit, such as an Off Chip Driver (OCD) circuit. The input/output circuit I/O includes a shift register connected to these input circuit and the output circuit and a buffer circuit. The input circuit, the output circuit, the shift register, and the buffer circuit are each connected to a terminal to which a power supply voltage $V_{CCQ}$ and the ground voltage $V_{SS}$ are applied. The data input/output terminals DQ0 to DQ7, the toggle signal input/output terminals DQS,/DQS, and the terminal to which the power supply voltage $V_{CCQ}$ is applied are, for example, achieved by the pad electrodes P described with reference to FIG. 2 and FIG. 3. According to the internal control signal from the logic circuit CTR, the data input via the data input/output terminals DQ0 to DQ7 is output to the cache memory CM, the address register ADR, or the command register CMR from the buffer circuit. According to the internal control signal from the logic circuit CTR, the data output via the data input/output terminals DQ0 to DQ7 is input to the buffer circuit from the cache memory CM or the status register STR.

The logic circuit CTR receives an external control signal from the controller die CD via external control terminals/CEn, CLE, ALE,/WE,/RE, RE and outputs an internal control signal to the input/output control circuit I/O according to this. Note that the external control terminals/CEn, CLE, ALE,/WE,/RE, RE are achieved, for example, by the pad electrodes P described with reference to FIG. 2 and FIG. 3.

[Structure of Memory Die MD]

Figure 8:
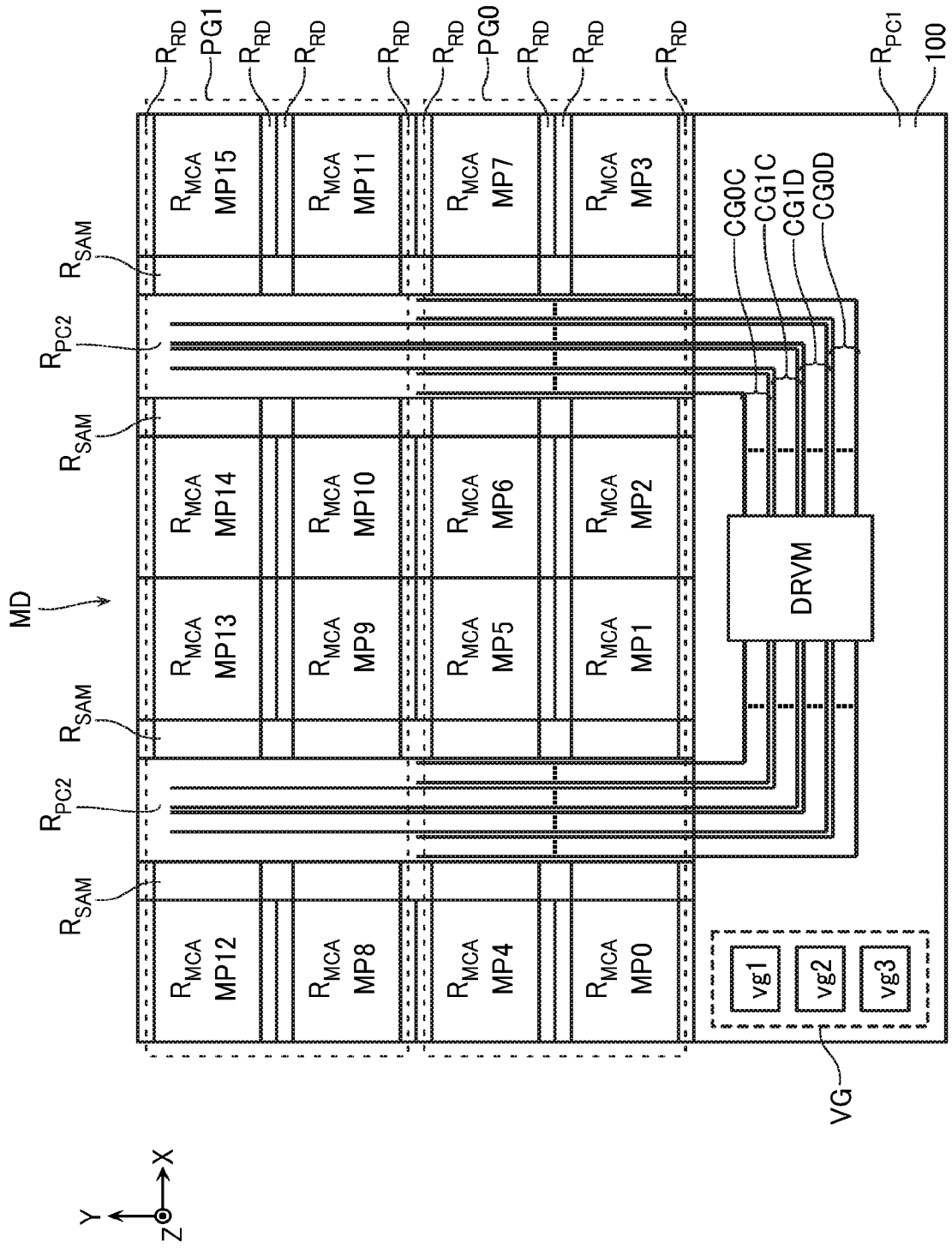
FIG. 8 is a schematic plan view of the memory die MD.
Figure 9:
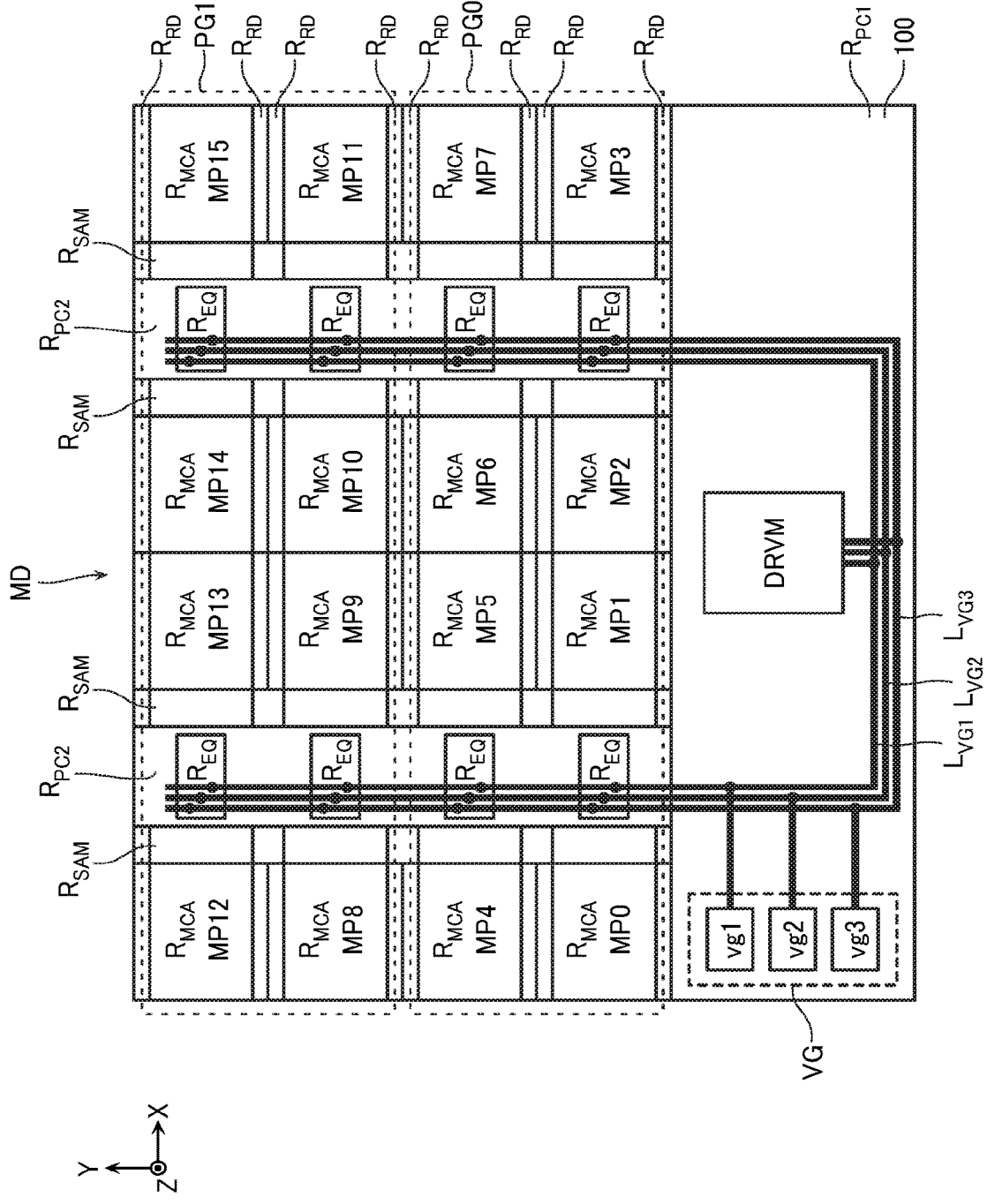
FIG. 9 is a schematic plan view of the memory die MD.
Figure 10:
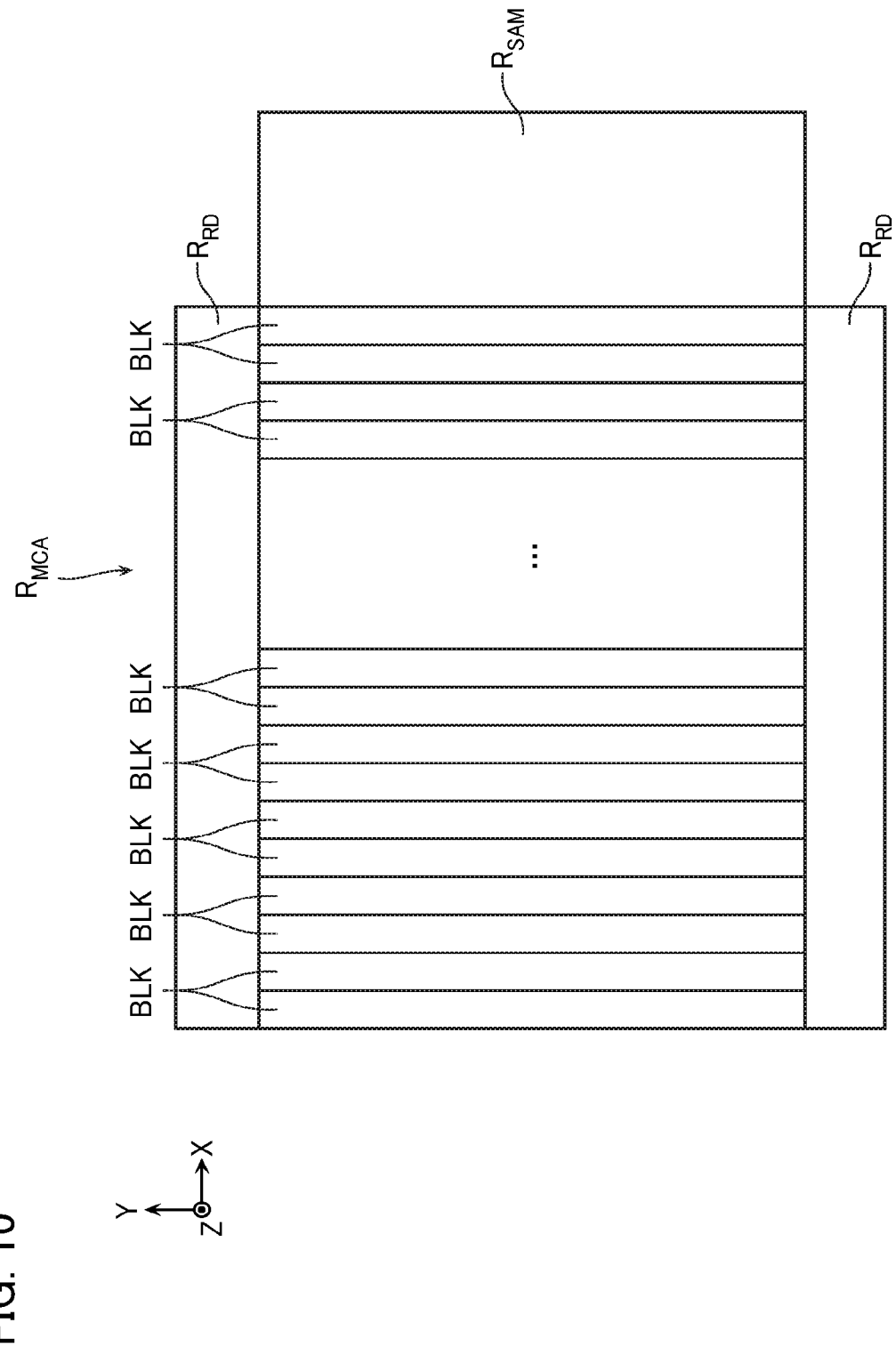
FIG. 10 is a schematic plan view illustrating an enlarged part of FIG. 8.
Figure 11:
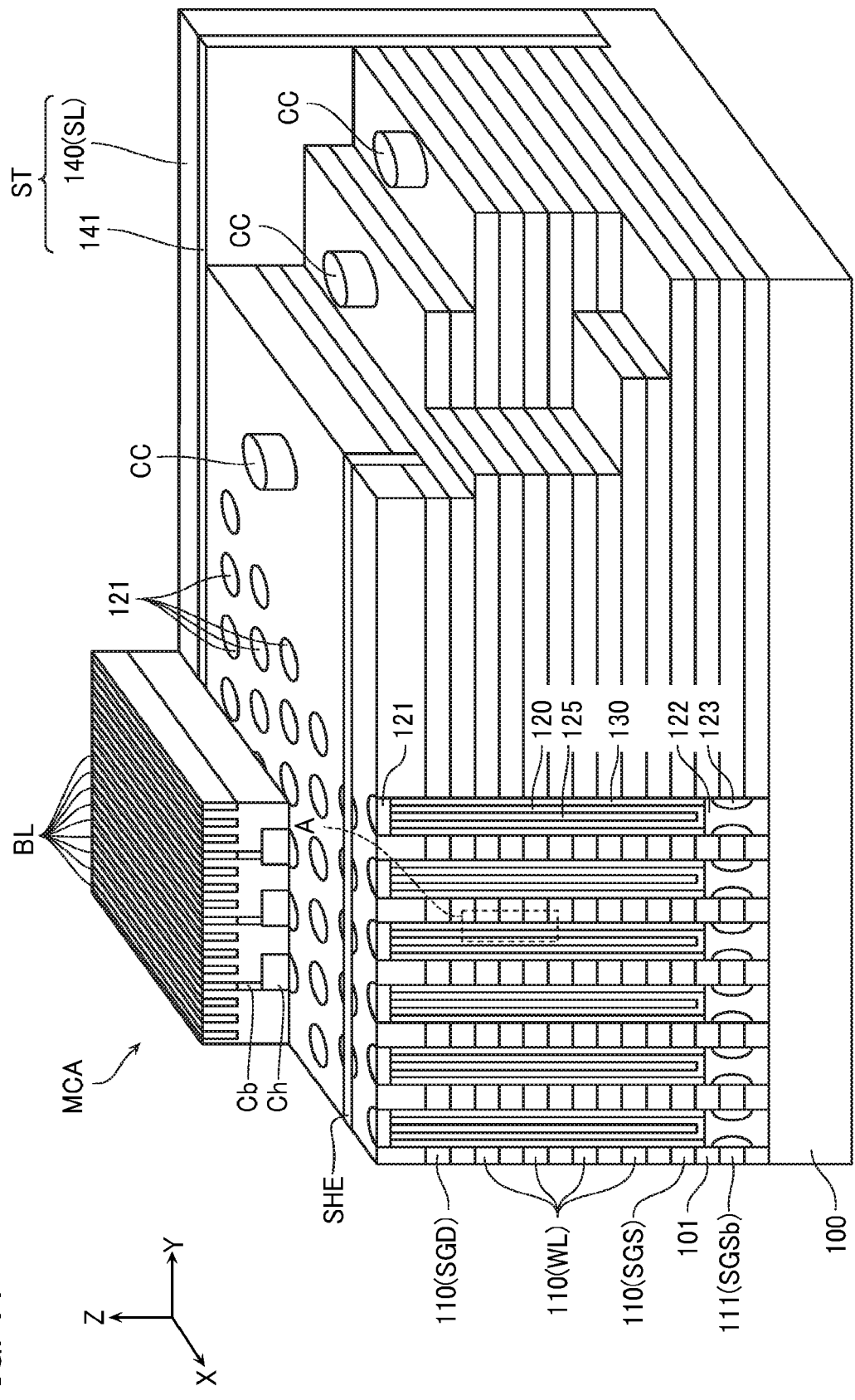
FIG. 11 is a schematic perspective view illustrating a configuration of a part of the memory die MD.
Figure 12:
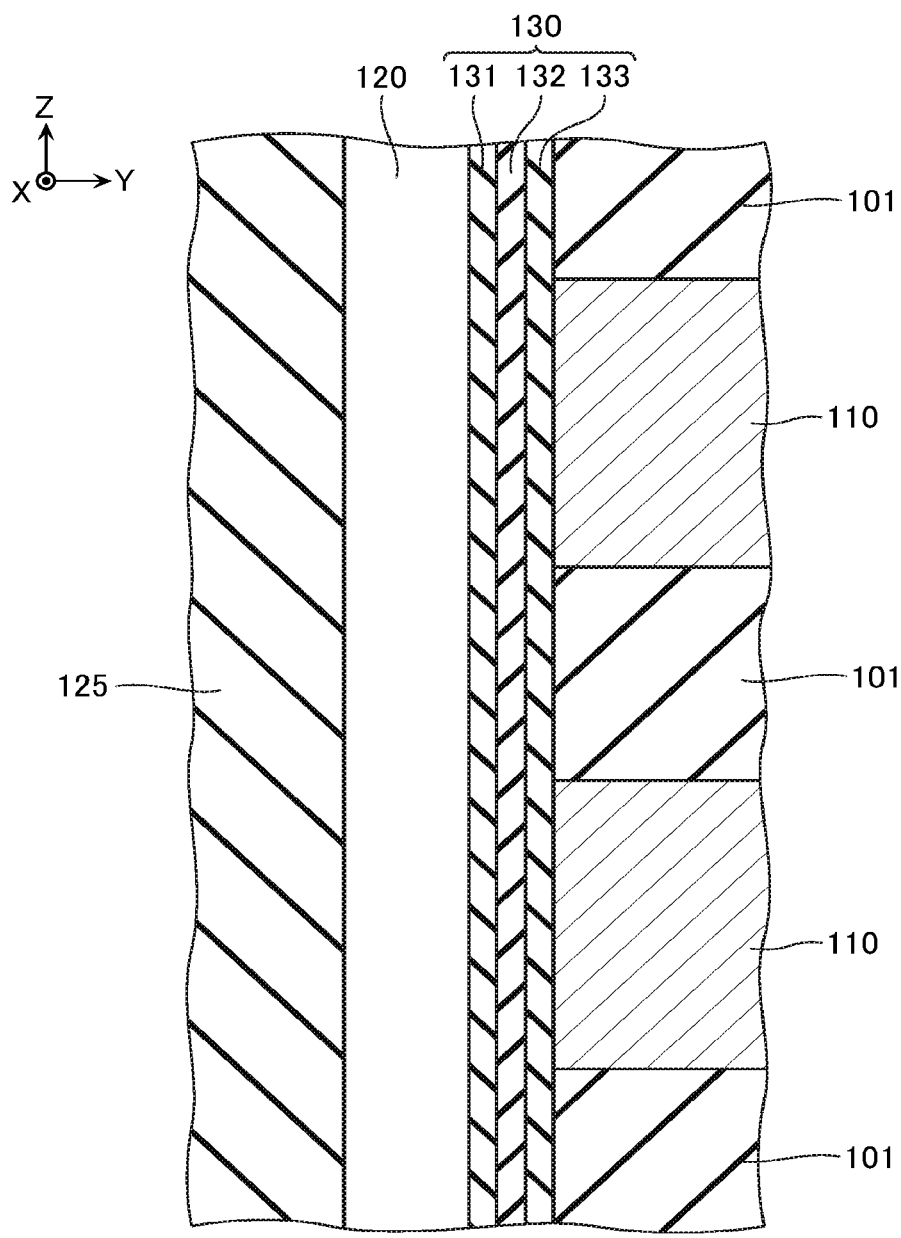
FIG. 12 is a schematic enlarged view of a part indicated by A in FIG. 11.

FIG. 8 and FIG. 9 are schematic plan views of the memory die MD. FIG. 8 schematically illustrates the wiring CG. FIG. 9 schematically illustrates the voltage supply lines $L_{VG1}$, $L_{VG2}$, $L_{VG3}$. FIG. 10 is a schematic plan view illustrating an enlarged part of FIG. 8. FIG. 11 is a schematic perspective view illustrating a configuration of a part of the memory die MD. FIG. 12 is a schematic enlarged view of a part indicated by A in FIG. 11.

As illustrated in FIG. 8, the memory die MD includes a semiconductor substrate 100. In the illustrated example, the semiconductor substrate 100 includes four rows in the X-direction. The four rows are made of four memory cell array regions $R_{MCA}$ arranged in the Y-direction. Between the first row and the second row counted from one side in the X-direction (for example, the negative side in the X-direction in FIG. 8), a peripheral circuit region $R_{PC2}$ is disposed. Similarly, between the third row and the fourth row counted from the one side in the X-direction, the peripheral circuit region $R_{PC2}$ is disposed. The semiconductor substrate 100 has an end portion in the Y-direction at which a peripheral circuit region $R_{PC1}$ is disposed.

[Structure of Semiconductor Substrate 100]

The semiconductor substrate 100 is, for example, a semiconductor substrate made of P-type silicon (Si) containing P-type impurities, such as boron (B). On a surface of the semiconductor substrate 100, for example, an N-type well region containing N-type impurities, such as phosphorus (P), a P-type well region containing P-type impurities, such as boron (B), a semiconductor substrate region where the N-type well region or the P-type well region is not disposed, and an insulating region are disposed. The N-type well region, the P-type well region, and the semiconductor substrate region each function as a plurality of the transistors constituting the peripheral circuit PC and parts of a plurality of the capacitors and the like.

[Structure of Memory Cell Array Region $R_{MCA}$]

In the illustrated example, configurations in four memory cell array regions $R_{MCA}$ closest to the peripheral circuit region $R_{PC1}$ function as parts of the memory plane MP0 to the memory plane MP3 in the order from the one side in the X-direction. Configurations in four memory cell array regions $R_{MCA}$ secondarily closest to the peripheral circuit region $R_{PC1}$ function as a part of the memory plane MP4 to the memory plane MP7 in the order from the one side in the X-direction. Configurations in four memory cell array regions $R_{MCA}$ thirdly closest to the peripheral circuit region $R_{PC1}$ function as parts of the memory plane MP8 to the memory plane MP11 in the order from the one side in the X-direction. Configurations in four memory cell array regions $R_{MCA}$ fourthly closest to the peripheral circuit region $R_{PC1}$ function as parts of the memory plane MP12 to the memory plane MP15 in the order from the one side in the X-direction.

The memory cell array region $R_{MCA}$ includes the plurality of memory blocks BLK arranged in the X-direction as illustrated in FIG. 10. The memory block BLK includes, for example, as illustrated in FIG. 11, a plurality of conductive layers 110 arranged in the Z-direction, a plurality of semiconductor columns 120 that extend in the Z-direction, and a plurality of gate insulating films 130 respectively disposed between the plurality of conductive layers 110 and the plurality of semiconductor columns 120. Between two memory blocks BLK adjacent in the X-direction, an inter-block structure ST is disposed.

The conductive layer 110 is a substantially plate-shaped conductive layer extending in the Y-direction. The conductive layer 110 may include a stacked film or the like of a barrier conductive film, such as titanium nitride (TiN), and a metal film, such as tungsten (W). For example, the conductive layer 110 may include polycrystalline silicon or the like containing impurities, such as phosphorus (P) or boron (B). Between the plurality of conductive layers 110 arranged in the Z-direction, insulating layers 101, such as silicon oxide ($SiO_2$), are disposed.

A conductive layer 111 is disposed below the conductive layer 110. The conductive layer 111 may include, for example, a stacked film or the like of a barrier conductive film, such as titanium nitride (TiN), and a metal film, such as tungsten (W). Between the conductive layer 111 and the conductive layer 110, the insulating layer 101, such as silicon oxide ($SiO_2$), is disposed.

The conductive layer 111 functions as the source-side select gate line SGSb (FIG. 5) and gate electrodes of the plurality of source-side select transistors STSb connected to the source-side select gate line SGSb. The conductive layers 111 are electrically independent in every memory block BLK.

Among the plurality of conductive layers 110, one or the plurality of conductive layers 110 positioned at the lowermost layer function as the source-side select gate line SGS (FIG. 5) and gate electrodes of the plurality of source-side select transistors STS connected to the source-side select gate line SGS.

The plurality of conductive layers 110 positioned above this layer function as the word lines WL (FIG. 5) and gate electrodes of the plurality of memory cells MC (FIG. 5) connected to the word lines WL. These plurality of conductive layers 110 are each electrically independent in every memory block BLK.

One or the plurality of conductive layers 110 positioned above this layer function as the drain-side select gate line SGD and gate electrodes of the plurality of drain-side select transistors STD (FIG. 5) connected to the drain-side select gate line SGD. Between two conductive layers 110 adjacent in the X-direction, an inter-string unit insulating layer SHE of, for example, silicon oxide ($SiO_2$) is disposed. These plurality of conductive layers 110 are each electrically independent in every string unit SU (FIG. 5).

Note that these plurality of conductive layers 110 have end portions in the Y-direction where connecting portions with a plurality of contacts CC are disposed. These plurality of contacts CC extend in the Z-direction, and have lower ends connected to the conductive layers 110. The contacts CC may, for example, include a stacked film or the like of a barrier conductive film, such as titanium nitride (TiN), and a metal film, such as tungsten (W).

The semiconductor columns 120 are arranged in the X-direction and the Y-direction in a predetermined pattern. The semiconductor columns 120 function as the channel regions of the plurality of memory cells MC and the select transistors (STD, STS, STSb) included in one memory string MS (FIG. 5). The semiconductor column 120 is, for example, a semiconductor layer, such as polycrystalline silicon (Si). For example, the semiconductor column 120 has a substantially closed-bottomed cylindrical shape and includes an insulating layer 125, such as silicon oxide, in the center part. The semiconductor column 120 has an outer peripheral surface that is surrounded by each of the conductive layers 110, and is opposed to the conductive layers 110.

The semiconductor column 120 has an upper end portion where an impurity region 121 containing N-type impurities, such as phosphorus (P), is disposed. The impurity region 121 is connected to the bit line BL extending in the X-direction via a contact Ch and a contact Cb.

The semiconductor column 120 has a lower end portion connected to a P-type well region of the semiconductor substrate 100 via a semiconductor layer 122 formed of single-crystal silicon (Si) and the like. The semiconductor layer 122 functions as a channel region of the source-side select transistor STSb. The semiconductor layer 122 has an outer peripheral surface that is surrounded by the conductive layer 111, and is opposed to the conductive layer 111. Between the semiconductor layer 122 and the conductive layer 111, an insulating layer 123, such as silicon oxide, is disposed.

The gate insulating film 130 has a substantially cylindrical shape that covers the outer peripheral surface of the semiconductor column 120.

The gate insulating film 130 includes, for example, as illustrated in FIG. 12, a tunnel insulating film 131, an electric charge accumulating film 132, and a block insulating film 133, which are stacked between the semiconductor column 120 and the conductive layers 110. The tunnel insulating film 131 and the block insulating film 133 are, for example, insulating films of silicon oxide ($SiO_2$) or the like. The electric charge accumulating film 132 is, for example, a film that can accumulate an electric charge of silicon nitride ($Si_3N_4$) or the like. The tunnel insulating film 131, the electric charge accumulating film 132, and the block insulating film 133, which have substantially cylindrical shapes, extend in the Z-direction along the outer peripheral surface of the semiconductor column 120.

Note that FIG. 12 illustrates an example in which the gate insulating film 130 includes the electric charge accumulating film 132 of silicon nitride or the like. However, the gate insulating film 130 may include, for example, a floating gate of polycrystalline silicon or the like containing N-type or P-type impurities.

The inter-block structure ST includes, for example, as illustrated in FIG. 11, a conductive layer 140 that extends in the Z-direction and the Y-direction and an insulating layer 141 disposed on a side surface in the X-direction of the conductive layer 140. The conductive layer 140 is connected to an N-type impurity region disposed in the P-type well region of the semiconductor substrate 100. The conductive layer 140 may include, for example, a stacked film or the like of a barrier conductive film, such as titanium nitride (TiN), and a metal film, such as tungsten (W). The conductive layer 140, for example, functions as a part of the source line SL (FIG. 5).

[Structure of Region Other Than Memory Cell Array Region $R_{MCA}$]

As illustrated in FIG. 8, at positions adjacent to the respective memory cell array regions $R_{MCA}$ in the Y-direction, row decoder regions $R_{RD}$ are disposed. In the row decoder region $R_{RD}$, the plurality of block decode units blkd (FIG. 6) and wirings CGL (FIG. 6) are disposed. At positions adjacent to the respective memory cell array regions $R_{mc}p$, in the X-direction, sense amplifier module regions $R_{SAM}$ are disposed. The sense amplifier module region $R_{SAM}$ includes the sense amplifier module SAM (FIG. 4).

The peripheral circuit region $R_{PC2}$ includes a plurality of wirings arranged in the X-direction and extending in the Y-direction. Parts of these plurality of wirings function as parts of the wirings CG, for example, as illustrated in FIG. 8. Parts of these plurality of wirings function as parts of the voltage supply lines $L_{VG1}$, $L_{VG2}$, $L_{VG3}$ for example, as illustrated in FIG. 9. At positions adjacent in the X-direction to the respective memory cell array regions $R_{MCA}$ in the peripheral circuit region $R_{PC2}$ equalizer regions $R_{EQ}$ are disposed. The equalizer region $R_{EQ}$ includes the equalizer EQ (FIG. 6). The equalizer EQ in each of the equalizer regions $R_{EQ}$ is connected to the voltage supply lines $L_{VG1}$, $L_{VG2}$, $L_{VG3}$.

The peripheral circuit region $R_{PC1}$ includes the driver module DRVM and the voltage generation circuit VG. The peripheral circuit region $R_{PC1}$ also includes a plurality of wirings. Parts of these plurality of wirings function as parts of the wirings CG, for example, as illustrated in FIG. 8. Parts of these plurality of wirings function as parts of the voltage supply lines $L_{VG1}$, $L_{VG2}$, $L_{VG3}$, for example, as illustrated in FIG. 9.

FIG. 9 exemplarily illustrates a voltage generation unit vg1 corresponding to the voltage supply line $L_{VG1}$, a voltage generation unit vg2 corresponding to the voltage supply line $L_{VG2}$, and a voltage generation unit vg3 corresponding to the voltage supply line $L_{VG3}$ as a configuration in the voltage generation circuit VG. The voltage generation unit vg1 generates a program voltage $V_{PGM}$, which will be described later, and outputs the program voltage $V_{PGM}$ in, for example, the write operation. The voltage generation unit vg1 generates an erase voltage $V_{ERA}$, which will be described later, and outputs the erase voltage $V_{ERA}$ in, for example, the erase operation. The voltage generation unit vg2 generates a read pass voltage $V_{READ}$, which will be described later, and outputs the read pass voltage $V_{READ}$ in, for example, the read operation. The voltage generation unit vg2 generates a write pass voltage $V_{PASS}$ and the read pass voltage $V_{READ}$, which will be described later, and outputs the write pass voltage $V_{PASS}$ and the read pass voltage $V_{READ}$ in, for example, the write operation. The voltage generation unit vg3 generates a read voltage $V_{CGR}$, which will be described later, and outputs the read voltage $V_{CGR}$ in, for example, the read operation. The voltage generation unit vg3 generates a verify voltage $V_{VFY}$, which will be described later, and outputs the verify voltage $V_{VFY}$ in, for example, the write operation.

Note that wiring resistance of the voltage supply lines $L_{VG1}$, $L_{VG2}$, $L_{VG3}$ is sufficiently small compared with wiring resistance of the wirings CG. The voltage supply lines $L_{VG1}$, $L_{VG2}$, $L_{VG3}$ have a wiring width larger than a wiring width of the wirings CG. The number of the voltage supply lines $L_{VG1}$, $L_{VG2}$, $L_{VG3}$ is less than the number of the wirings CG.

[Threshold Voltage of Memory Cell MC]

Next, a threshold voltage of the memory cell MC will be described with reference to FIG. 13A, FIG. 13B, and FIG. 13C.

Figures 13A, 13B, 13C:
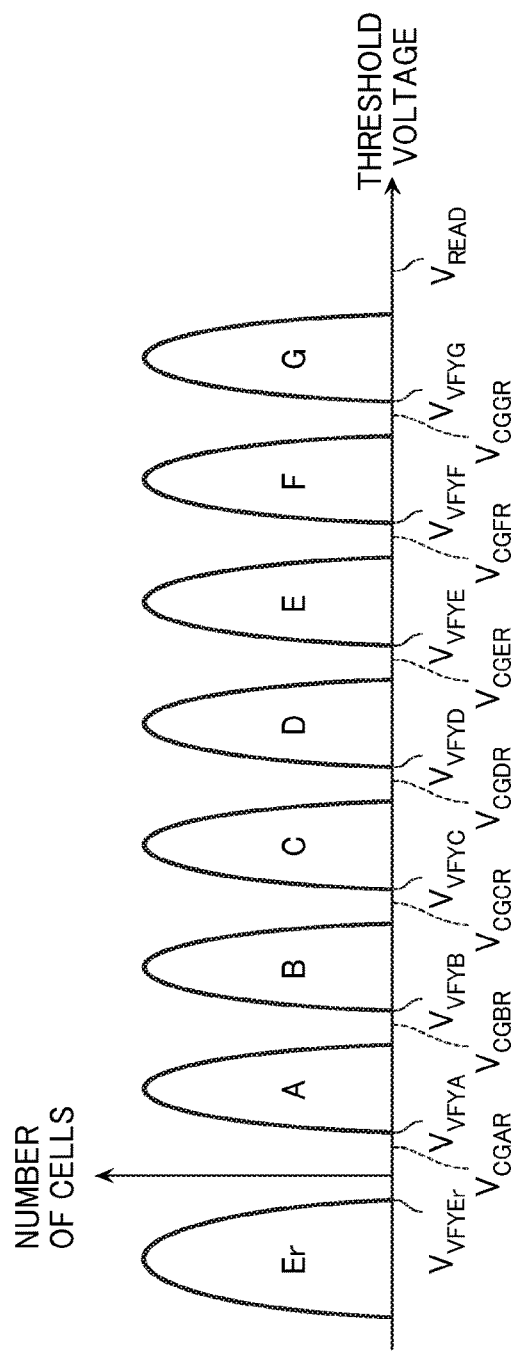
FIG. 13A is a schematic histogram for describing a threshold voltage of the memory cell MC in which 3-bit data is stored.
FIG. 13B is a table illustrating an exemplary relation between the threshold voltage of the memory cell MC in which the 3-bit data is stored and the stored data.
FIG. 13C is a table illustrating another exemplary relation between the threshold voltage of the memory cell MC in which the 3-bit data is stored and the stored data.

FIG. 13A is a schematic histogram for describing the threshold voltage of the memory cell MC in which 3-bit data is stored. The horizontal axis indicates a voltage of the word line WL, and the vertical axis indicates the number of the memory cells MC. FIG. 13B is a table illustrating an exemplary relation between the threshold voltage of the memory cell MC in which the 3-bit data is stored and the stored data. FIG. 13C is a table illustrating another exemplary relation between the threshold voltage of the memory cell MC in which the 3-bit data is stored and the stored data.

In the example in FIG. 13A, the threshold voltage of the memory cell MC is controlled in eight patterns of states. The threshold voltage of the memory cell MC controlled in a state Er is smaller than an erase verify voltage $V_{VFYEr}$. For example, the threshold voltage of the memory cell MC controlled in a state A is larger than a verify voltage $V_{VFYA}$ and smaller than a verify voltage $V_{VFYB}$. For example, the threshold voltage of the memory cell MC controlled in a state B is larger than the verify voltage $V_{VFYB}$ and smaller than a verify voltage $V_{VFYC}$. The same applies to the following, and the threshold voltages of the memory cell MC controlled in a state C to a state F are respectively larger than the verify voltage $V_{VFYC}$ to a verify voltage $V_{VFYF}$ and smaller than a verify voltage $V_{VFYD}$ to a verify voltage $V_{VFYG}$. For example, the threshold voltage of the memory cell MC controlled in a state G is larger than the verify voltage $V_{VFYG}$ and smaller than the read pass voltage $V_{READ}$.

In the example in FIG. 13A, a read voltage $V_{CGAR}$ is set between a threshold distribution corresponding to the state Er and a threshold distribution corresponding to the state A. A read voltage $V_{CGBR}$ is set between the threshold distribution corresponding to the state A and a threshold distribution corresponding to the state B. The same applies to the following, and a read voltage $V_{CGCR}$ to a read voltage $V_{CGGR}$ are respectively set between the threshold distribution corresponding to the state B and a threshold distribution corresponding to the state C to between a threshold distribution corresponding to the state F and a threshold distribution corresponding to the state G.

For example, the state Er corresponds to the lowest threshold voltage (the threshold voltage of the memory cell MC in an erase state). For example, data "111" is assigned to the memory cell MC corresponding to the state Er.

The state A corresponds to the threshold voltage higher than the threshold voltage corresponding to the above-described state Er. For example, data "101" is assigned to the memory cell MC corresponding to the state A.

The state B corresponds to the threshold voltage higher than the threshold voltage corresponding to the above-described state A. For example, data "001" is assigned to the memory cell MC corresponding to the state B.

The same applies to the following, and the state C to the state G in the drawing correspond to the threshold voltages higher than the threshold voltages corresponding to the state B to the state F. For example, data "011", "010", "110", "100", "000" are assigned to the memory cell MC corresponding to these distributions.

Note that, in the case of the assignment as exemplified in FIG. 13B, the data of a low-order bit is distinguishable with one read voltage $V_{CGDR}$. The data of a middle-order bit is distinguishable with three read voltages $V_{CGAR}$, $V_{CGCR}$, $V_{CGFR}$. The data of a high-order bit is distinguishable with three read voltages $V_{CGBR}$, $V_{CGER}$, $V_{CGGR}$. Such an assignment of the data is referred to as a 1-3-3 code in some cases.

Note that the number of bits of the data stored in the memory cell MC, the number of states, the assignment of the data to each state, and the like are changeable as necessary.

For example, in the case of the assignment as exemplified in FIG. 13C, the data of the low-order bit is distinguishable with one read voltage $V_{CGDR}$. The data of the middle-order bit is distinguishable with the two read voltages $V_{CGBR}$, $V_{CGFR}$. The data of the high-order bit is distinguishable with the four read voltages $V_{CGAR}$, $V_{CGCR}$, $V_{CGER}$, $V_{CGGR}$. Such an assignment of the data is referred to as a 1-2-4 code in some cases.

[Read Operation]

Next, the read operation of the semiconductor memory device according to the embodiment will be described.

Figure 14:
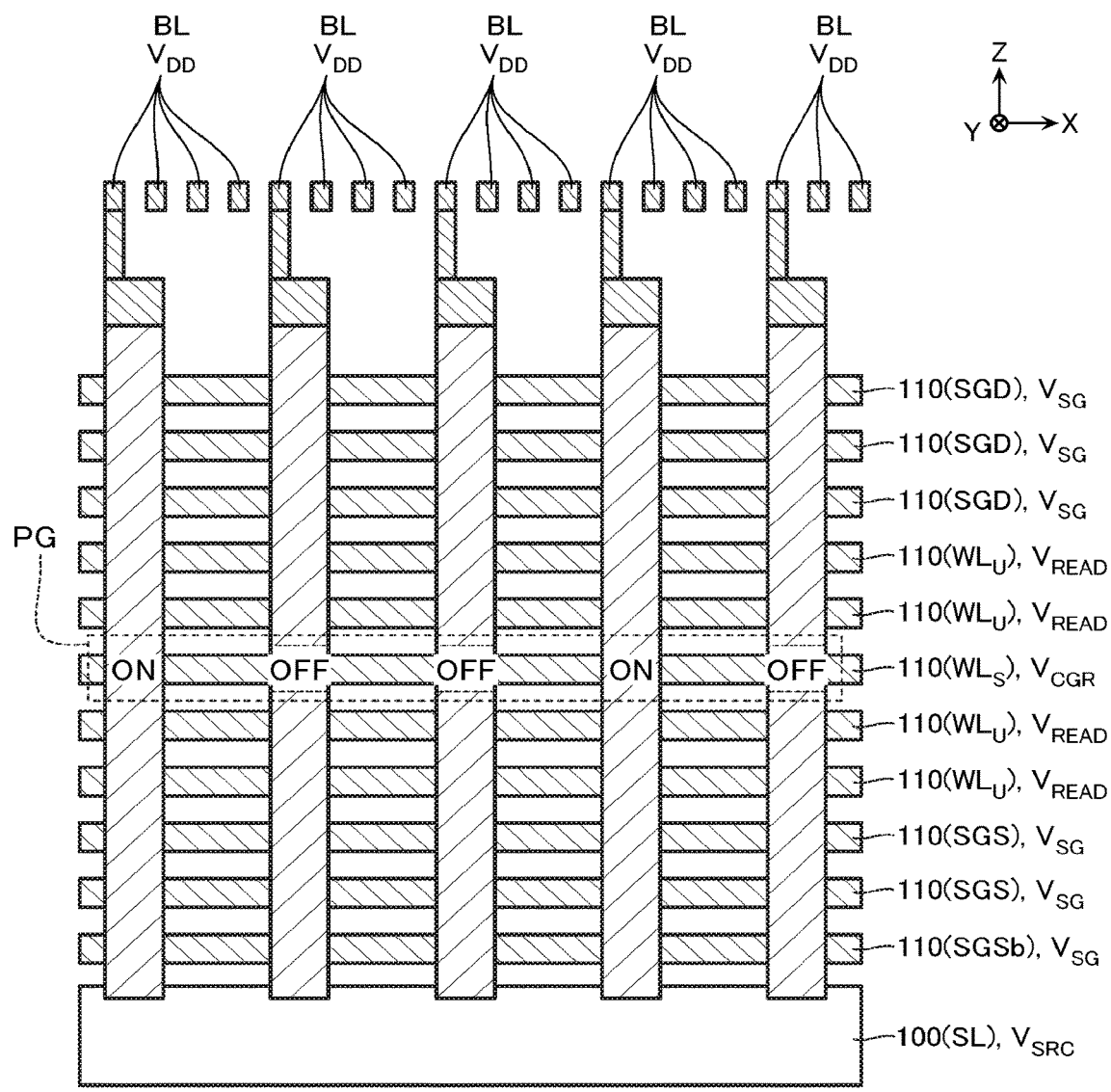
FIG. 14 is a schematic cross-sectional view for describing a read operation.
Figure 15:
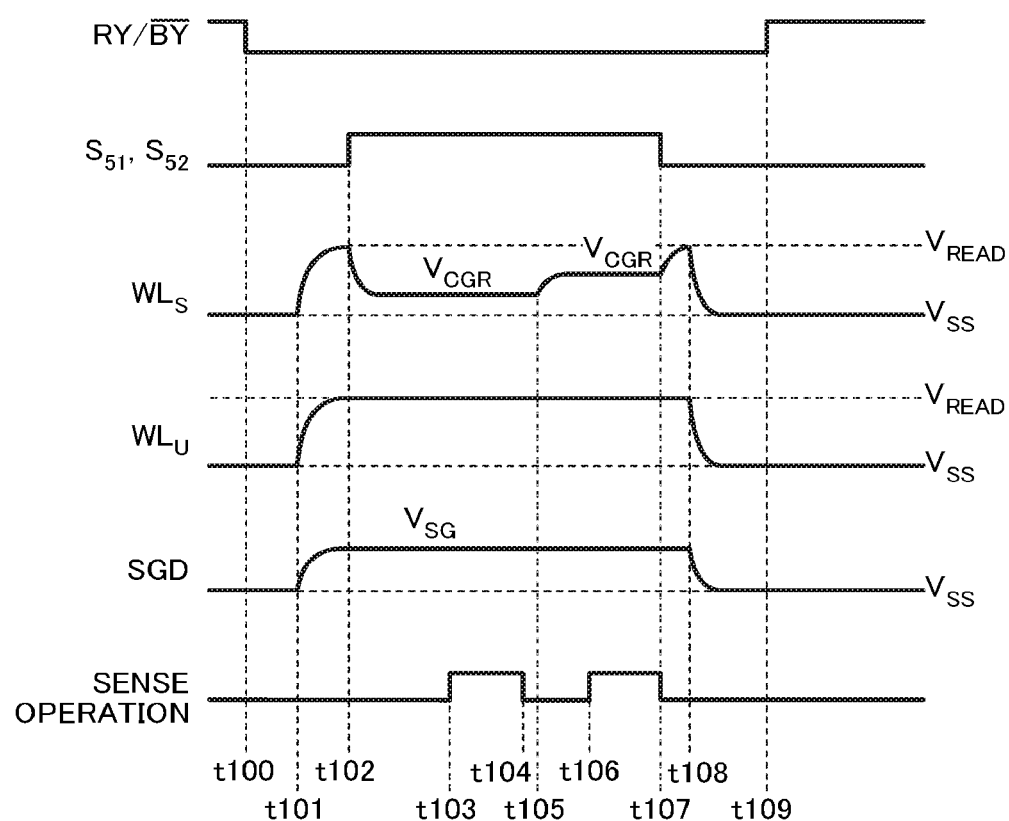
FIG. 15 is a timing chart for describing the read operation.

FIG. 14 is a schematic cross-sectional view for describing the read operation. FIG. 15 is a timing chart for describing the read operation.

Note that, in this specification, the word line WL as an object of operation may be referred to as the selected word line $WL_S$ and the other word line WL may be referred to as the unselected word line $WL_U$. Also, this specification will describe an example where the read operation is executed on the memory cell MC connected to the selected word line $WL_S$ (hereinafter may be referred to as a "selected memory cell MC") among the plurality of memory cells MC included in the string unit SU as an object of operation. In the following description, a configuration that includes such a plurality of memory cells MC may be referred to as a selected page PG.

At timing t100 of the read operation, for example, as illustrated in FIG. 15, the voltage of the terminal RY//BY enters the "L" state.

At timing t101 of the read operation, the read pass voltage $V_{READ}$ is applied to the selected word line $WL_S$ and the unselected word line $WL_U$ to cause all the memory cells MC to be in the ON state. A voltage $V_{SG}$ is applied to the select gate lines (SGD, SGS, SGSb). The voltage $V_{SG}$ has a magnitude enough to form electron channels in the channel regions of the select transistors (STD, STS, STSb), thereby causing the select transistors (STD, STS, STSb) to be in the ON state.

At timing t102 of the read operation, the predetermined read voltage $V_{CGR}$ is applied to the selected word line $WL_S$. The predetermined read voltage $V_{CGR}$ is any one of the read voltages $V_{CGAR}$ to $V_{CGGR}$ described with reference to FIG. 13A. This causes a part of the selected memory cells MC to be in the ON state, and the remaining selected memory cells MC to be in the OFF state, for example, as illustrated in FIG. 14.

Note that at timing t102, the voltages of signal lines $S_{51}$, $S_{52}$ rise from the "L" state to the "H" state. In association with this, the current path through the node 201 (FIG. 7) and the voltage supply line $L_{VG3}$ between the selected word line $WL_S$ and the voltage generation circuit VG enters a conductive state.

At timing t102, for example, a voltage $V_{DD}$ is applied to the bit lines BL. For example, a voltage $V_{SRC}$ is applied to the source line SL. The voltage $V_{SRC}$ has, for example, a magnitude approximately the same as the ground voltage $V_{SS}$. The voltage $V_{SRC}$ may be, for example, slightly larger than the ground voltage $V_{SS}$ and sufficiently smaller than the voltage $V_{DD}$.

From timing t103 to timing t104 of the read operation, for example, as illustrated in FIG. 15, the sense operation is executed to obtain data indicative of the state of the memory cell MC. The sense operation is, for example, an operation that detects the ON state/OFF state of the memory cell MC by the sense amplifier module SAM (FIG. 4).

At timing t105 of the read operation, another read voltage $V_{CGR}$ (any one of the read voltages $V_{CGAR}$ to $V_{CGGR}$ described with reference to FIG. 13A) is applied to the selected word line $WL_S$ This causes a part of the selected memory cells MC to be in the ON state and the remaining selected memory cells MC to be in the OFF state.

From timing t106 to timing t107 of the read operation, for example, as illustrated in FIG. 15, the sense operation is executed to obtain data indicative of the state of the memory cell MC.

At timing t107 of the read operation, the read pass voltage $V_{READ}$ is applied to the selected word line $WL_S$ and the unselected word line $WL_U$ to cause all the memory cells MC to be in the ON state. The voltage $V_{SG}$ is applied to the select gate lines (SGD, SGS, SGSb) to cause the select transistors (STD, STS, STSb) to be in the ON state.

Note that, at timing t107, the voltages of the signal lines $S_{51}$, $S_{52}$ fall from the "H" state to the "L" state. In association with this, the current path through the node 201 (FIG. 7) and the voltage supply line $L_{VG3}$ between the selected word line $WL_S$ and the voltage generation circuit VG enters a disconnected state.

At timing t108 of the read operation, the ground voltage $V_{SS}$ is applied to the selected word line $WL_S$, the unselected word line $WL_U$, and the select gate lines (SGD, SGS, SGSb).

At timing t109 of the read operation, the voltage of the terminal RY//BY enters the "H" state.

Note that, in the read operation, arithmetic processing, such as AND and OR, is executed on the data indicative of the state of the above-described memory cell MC, and this calculates the data stored in the memory cell MC. This data is forwarded to the cache memory CM (FIG. 4).

[Write Operation]

Next, the write operation of the semiconductor memory device according to the embodiment will be described.

Figure 16:
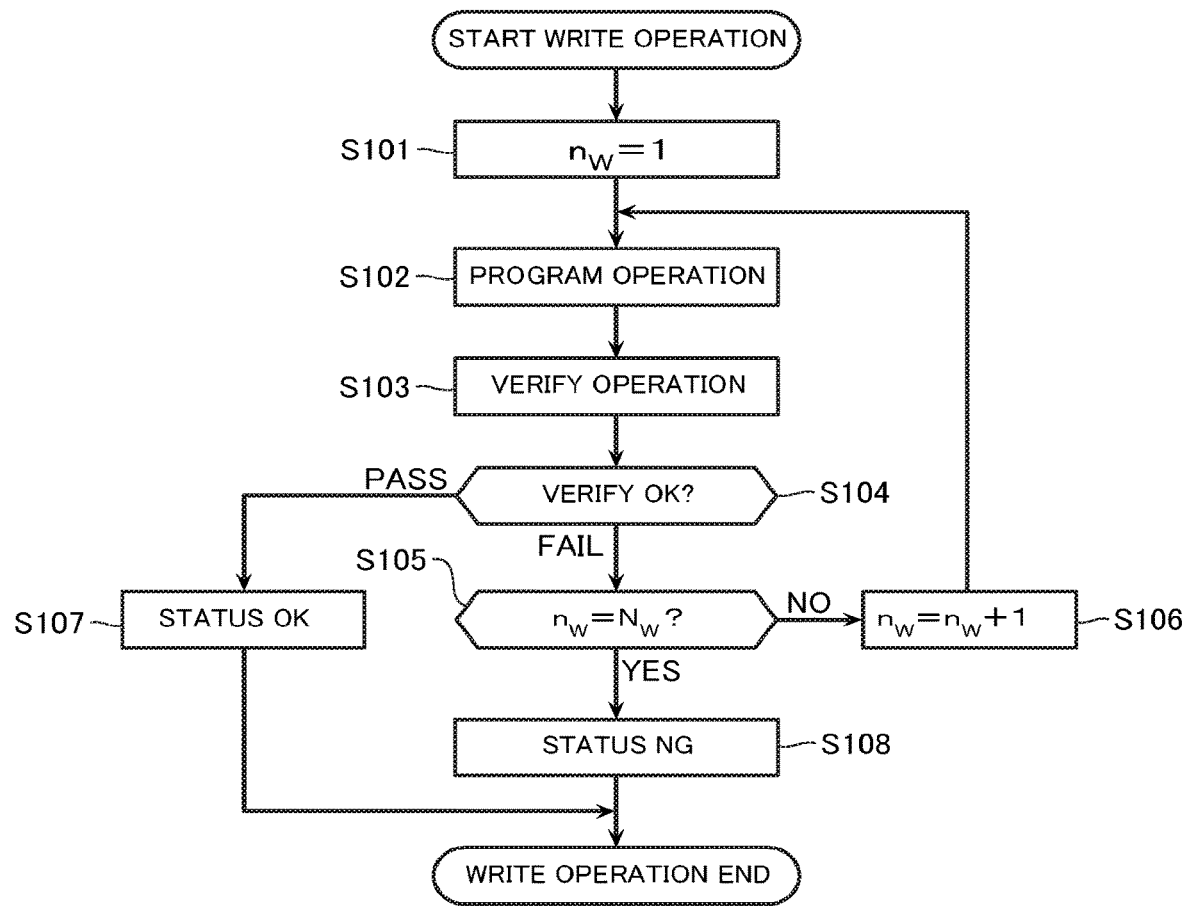
FIG. 16 is a flowchart for describing a write operation.
Figure 17:
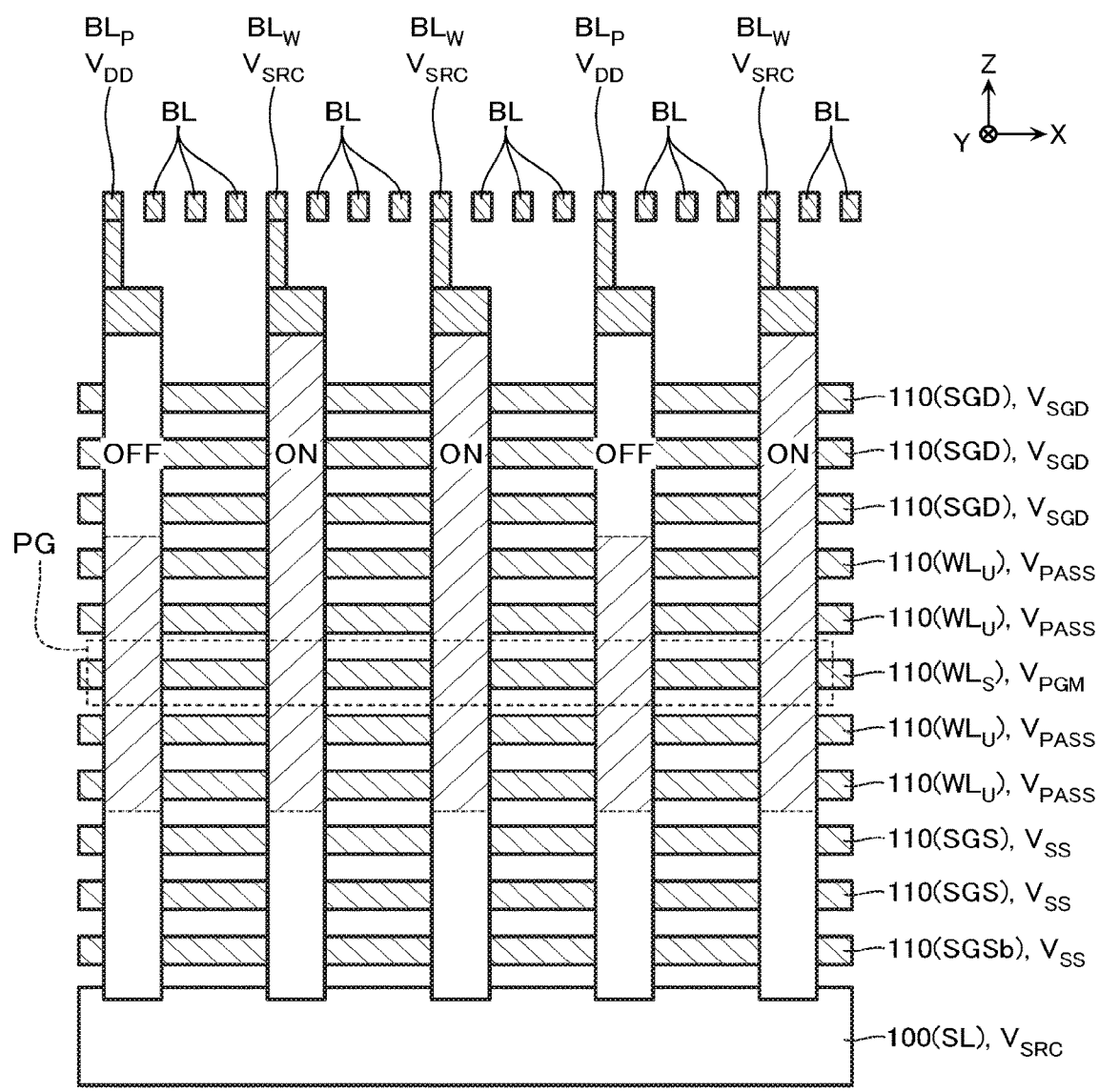
FIG. 17 is a schematic cross-sectional view for describing a program operation included in the write operation.
Figure 18:
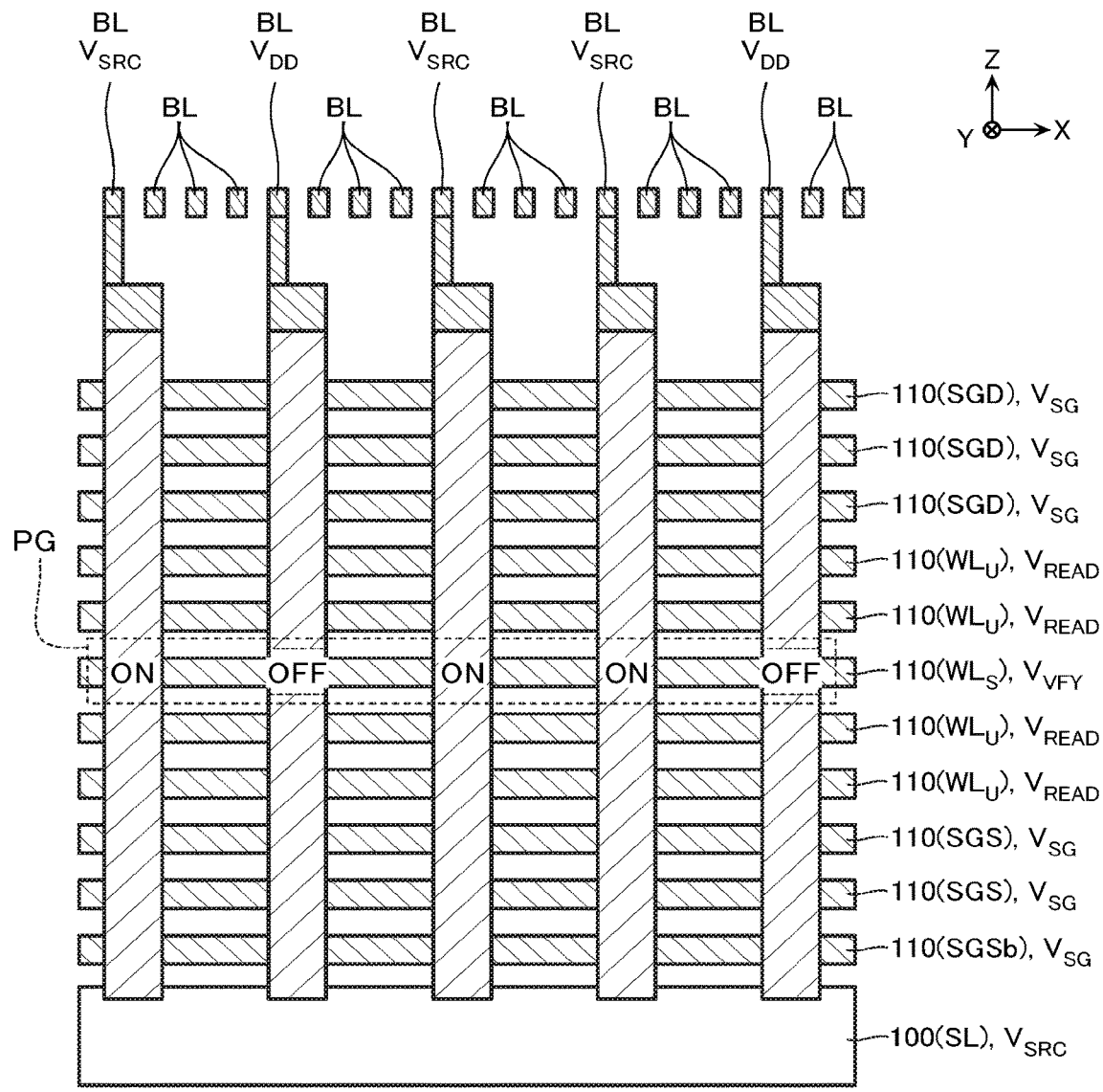
FIG. 18 is a schematic cross-sectional view for describing a verify operation included in the write operation.
Figure 19:
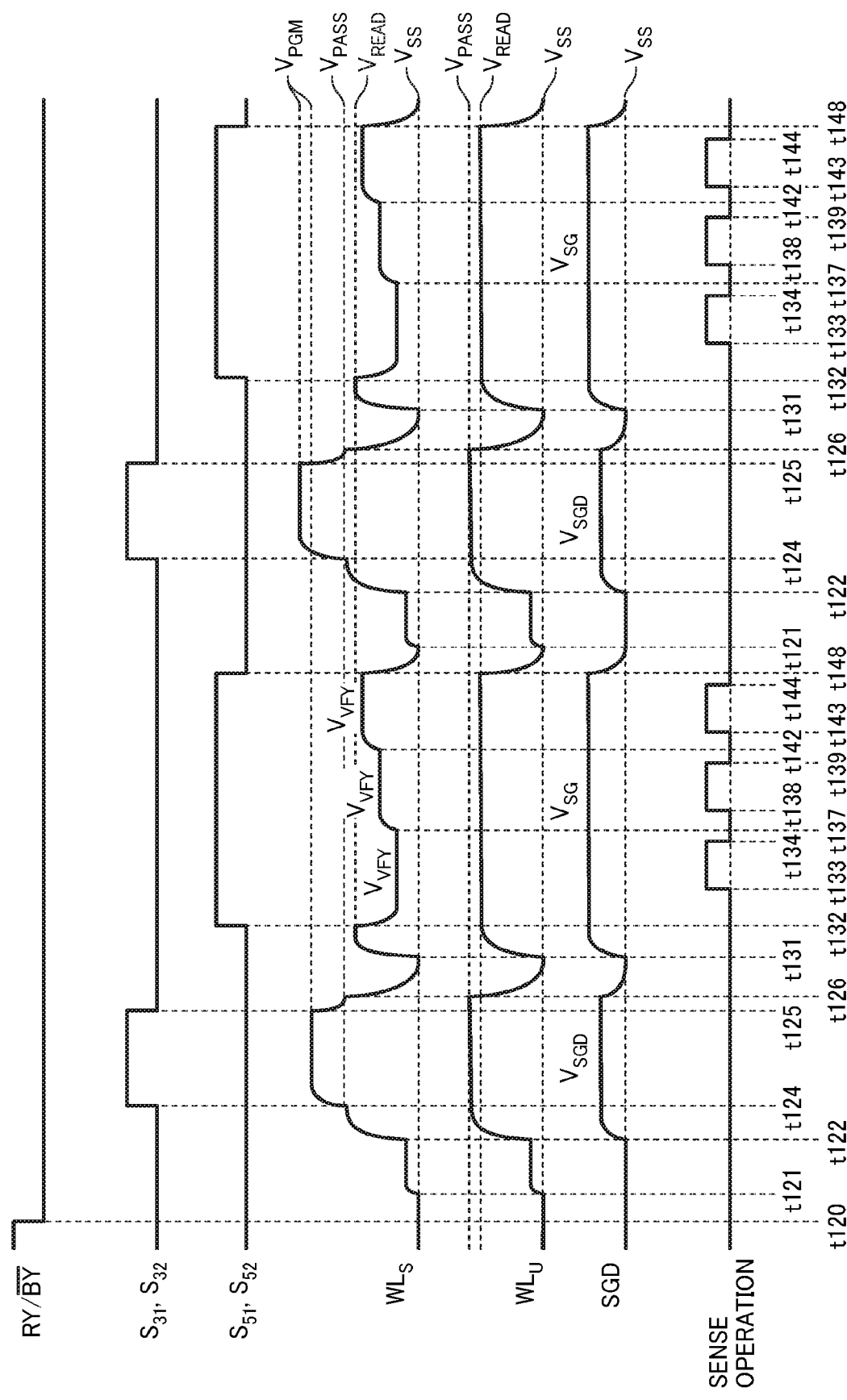
FIG. 19 is a timing chart for describing the write operation.

FIG. 16 is a flowchart for describing the write operation. FIG. 17 is a schematic cross-sectional view for describing a program operation included in the write operation. FIG. 18 is a schematic cross-sectional view for describing a verify operation included in the write operation. FIG. 19 is a timing chart for describing the write operation.

Note that the following description will describe an example where the write operation is executed on the plurality of selected memory cells MC corresponding to the selected page PG.

At timing t120 of the write operation, for example, as illustrated in FIG. 19, the voltage of the terminal RY//BY enters the "L" state.

At Step S101, for example, as illustrated in FIG. 16, a loop count $n_W$ is set to 1. The loop count $n_W$ is a variable indicative of the count of write loop. This operation is, for example, executed at timing t120 in FIG. 19. For example, user data to be written to the memory cell MC is latched in the sense amplifier module SAM.

At Step S102, the program operation is executed. The program operation is an operation that applies the program voltage to the selected word line $WL_S$ to increase the threshold voltage of the memory cell MC. This operation is, for example, executed from timing t121 to timing t126 in FIG. 19.

At timing t121 of the program operation, for example, the voltage $V_{SRC}$ is applied to a bit line $BL_W$ connected to the selected memory cell MC on which the adjustment of the threshold voltage is executed among the plurality of selected memory cells MC and the voltage $V_{DD}$ is applied to a bit line $BL_P$ connected to the selected memory cell MC on which the adjustment of the threshold voltage is not executed among the plurality of selected memory cells MC. Hereinafter, the selected memory cell MC on which the adjustment of the threshold voltage is executed among the plurality of selected memory cells MC is referred to as a "write memory cell MC" and the selected memory cell MC on which the adjustment of the threshold voltage is not executed is referred to as an "inhibited memory cell MC" in some cases.

At timing t122 of the program operation, the write pass voltage $V_{PASS}$ is applied to the selected word line $WL_S$ and the unselected word line $WL_U$. The voltage $V_{SGD}$ is applied to the drain-side select gate line SGD. The write pass voltage $V_{PASS}$ may have a magnitude approximately as same as the read pass voltage $V_{READ}$ described with reference to FIG. 13A or may be larger than the read pass voltage $V_{READ}$. The voltage $V_{SGD}$ is smaller than the voltage $V_{SG}$ described with reference to FIG. 14 and FIG. 15 and has a magnitude enough to cause the drain-side select transistor STD to be in the ON state or the OFF state according to the voltage of the bit line BL.

At timing t124 of the program operation, the program voltage $V_{PGM}$ is applied to the selected word line $WL_S$. The program voltage $V_{PGM}$ is larger than the write pass voltage $V_{PASS}$.

Here, for example, as illustrated in FIG. 17, the voltage $V_{SRC}$ is applied to the channel of the semiconductor column 120 connected to the bit line $BL_W$. Between such a semiconductor column 120 and the selected word line $WL_S$, a relatively large electric field is generated. This causes electrons in the channel of the semiconductor column 120 to tunnel into the electric charge accumulating film 132 (FIG. 12) via the tunnel insulating film 131 (FIG. 12). This increases the threshold voltage of the write memory cell MC.

On the other hand, the channel of the semiconductor column 120 connected to the bit line BLp is in an electrically floating state, and the voltage of this channel is increased up to approximately the write pass voltage $V_{PASS}$ by the capacitive coupling to the unselected word line $WL_U$. Between such a semiconductor column 120 and the selected word line $WL_S$, only an electric field smaller than any of the above-described electric fields is generated. Therefore, the electrons in the channel of the semiconductor column 120 do not tunnel into the electric charge accumulating film 132 (FIG. 12). Therefore, the threshold voltage of the inhibited memory cell MC does not increase.

Note that, at timing t124, the voltages of the signal lines $S_{31}$, $S_{32}$ rise from the "L" state to the "H" state. In association with this, the current path through the node 201 (FIG. 7) and the voltage supply line $L_{VG1}$ between the selected word line $WL_S$ and the voltage generation circuit VG enters a conductive state.

At timing t125 of the program operation, the write pass voltage $V_{PASS}$ is applied to the selected word line $WL_S$ and the unselected word line $WL_U$.

Note that, at timing t125, the voltages of the signal lines $S_{31}$, $S_{32}$ fall from the "H" state to the "L" state. In association with this, the current path through the node 201 (FIG. 7) and the voltage supply line $L_{VG1}$ between the selected word line $WL_S$ and the voltage generation circuit VG enters a disconnected state.

At timing t126 of the program operation, the ground voltage $V_{SS}$ is applied to the selected word line $WL_S$, the unselected word line $WL_U$, and the select gate lines (SGD, SGS, SGSb).

At Step S103 (FIG. 16), the verify operation is executed.

At timing t131 of the verify operation, for example, as illustrated in FIG. 19, the read pass voltage $V_{READ}$ is applied to the selected word line $WL_S$ and the unselected word line $WL_U$ to cause all the memory cells MC to be in the ON state. The voltage $V_{SG}$ is applied to the select gate lines (SGD, SGS, SGSb) to cause the select transistors (STD, STS, STSb) to be in the ON state.

At timing t132 of the verify operation, the predetermined verify voltage $V_{VFY}$ is applied to the selected word line $WL_S$. The predetermined verify voltage $V_{VFY}$ is any one of the verify voltages $V_{VFYA}$ to $V_{VFYG}$ described with reference to FIG. 13A. This causes, for example, as illustrated in FIG. 18, a part of the selected memory cells MC to be in the ON state and the remaining selected memory cells MC to be in the OFF state.

Note that, at timing t132, the voltages of the signal lines $S_{51}$, $S_{52}$ rise from the "L" state to the "H" state. In association with this, the current path through the node 201 (FIG. 7) and the voltage supply line $L_{VG3}$ between the selected word line $WL_S$ and the voltage generation circuit VG enters a conductive state.

At timing t132, for example, the voltage $V_{DD}$ is applied to the bit line BL. At this time, for example, the voltage $V_{DD}$ may be applied to the bit line BL connected to the memory cell MC corresponding to a specific state and the voltage $V_{SRC}$ may be applied to the other bit line BL.

From timing t133 to timing t134 of the verify operation, for example, as illustrated in FIG. 19, the sense operation is executed to obtain data indicative of the state of the memory cell MC.

From timing t137 to timing t139 of the verify operation, a process similar to that from timing t132 to timing t134 is executed on the memory cell MC in another state.

From timing t142 to timing t144 of the verify operation, a process similar to that from timing t132 to timing t134 is executed on the memory cell MC in another state.

At timing t148 of the verify operation, the ground voltage $V_{SS}$ is applied to the selected word line $WL_S$, the unselected word line $WL_U$, and the select gate lines (SGD, SGS, SGSb).

Note that, at timing t148, the voltages of the signal lines $S_{51}$, $S_{52}$ fall from the "H" state to the "L" state. In association with this, the current path through the node 201 (FIG. 7) and the voltage supply line $L_{VG3}$ between the selected word line $WL_S$ and the voltage generation circuit VG enters a disconnected state.

Afterwards, the obtained data is transferred to a counter circuit (not illustrated). The counter circuit counts the number of the memory cells MC whose threshold voltages have reached a target value or the number of the memory cells MC whose threshold voltages have not reached the target value.

Note that the example in FIG. 19 illustrates the example where three patterns of the verify voltages $V_{VFY}$ are applied to the selected word line $WL_S$ in the verify operation. However, the number of the verify voltages $V_{VFY}$ applied to the selected word line $WL_S$ in the verify operation may be two patterns or less, may be four patterns or more, or may change according to the loop count $n_W$.

At Step S104 (FIG. 16), the result of the verify operation is determined. For example, with reference to the above-described counter circuit, for example, when the number of the memory cells MC whose threshold voltages have not reached the target value is a certain number or more, it is determined to be verify FAIL and the procedure proceeds to Step S105. On the other hand, for example, when the number of the memory cells MC whose threshold voltages have not reached the target value is a certain number or less, it is determined to be verify PASS and the procedure proceeds to Step S107.

At Step S105, whether the loop count $n_W$ has reached a predetermined number $N_w$ or not is determined. When it has not reached the predetermined number $N_w$, the procedure proceeds to Step S106. When it has reached the predetermined number $N_w$, the procedure proceeds to Step S108.

At Step S106, one is added to the loop count $n_W$, and the procedure proceeds to Step S102. At Step S106, for example, a predetermined voltage $\Delta V$ is added to the program voltage $V_{PGM}$. Therefore, the program voltage $V_{PGM}$ increases together with the increase of the loop count $n_W$.

At Step S107, status data of successful completion of the write operation is stored in the status register STR (FIG. 4) and the write operation is terminated. Note that, the status data is output to the controller die CD (FIG. 1) by a status read operation.

At Step S108, status data of unsuccessful completion of the write operation is stored in the status register STR (FIG. 4) and the write operation is terminated.

[Erase Operation]

Next, the erase operation of the semiconductor memory device according to the embodiment will be described.

Figure 20:
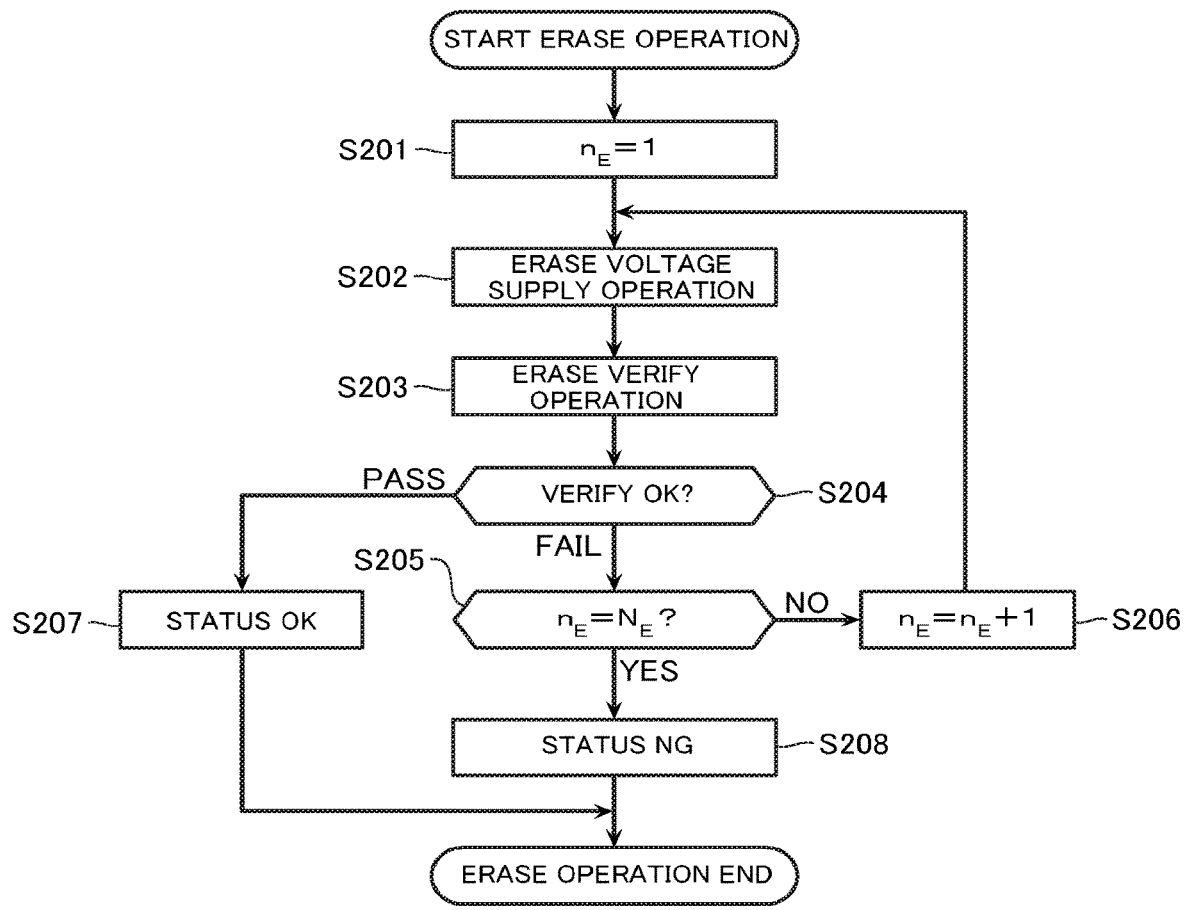
FIG. 20 is a flowchart for describing an erase operation.
Figure 21:
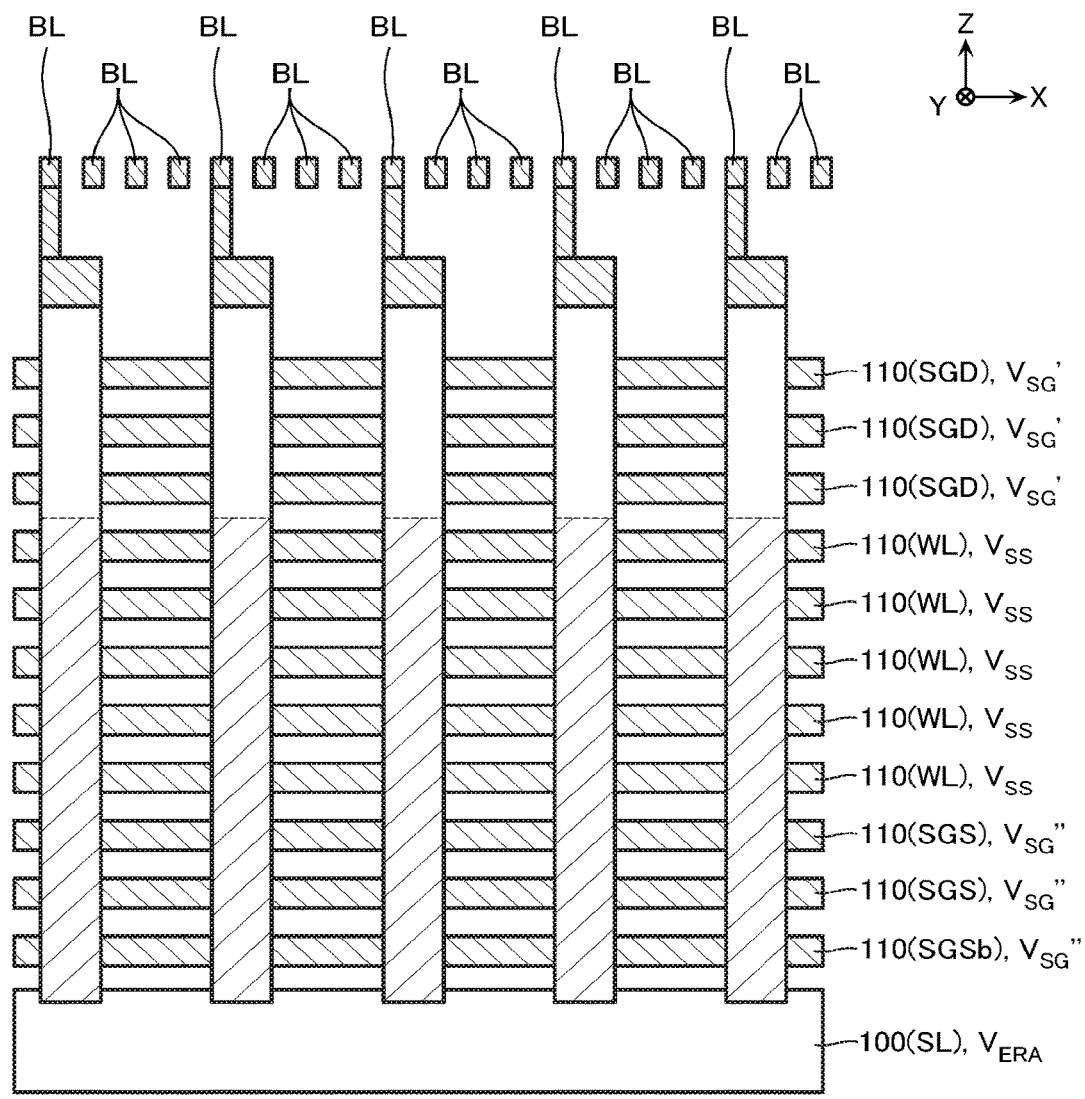
FIG. 21 is a schematic cross-sectional view for describing an erase voltage supply operation included in the erase operation.
Figure 22:
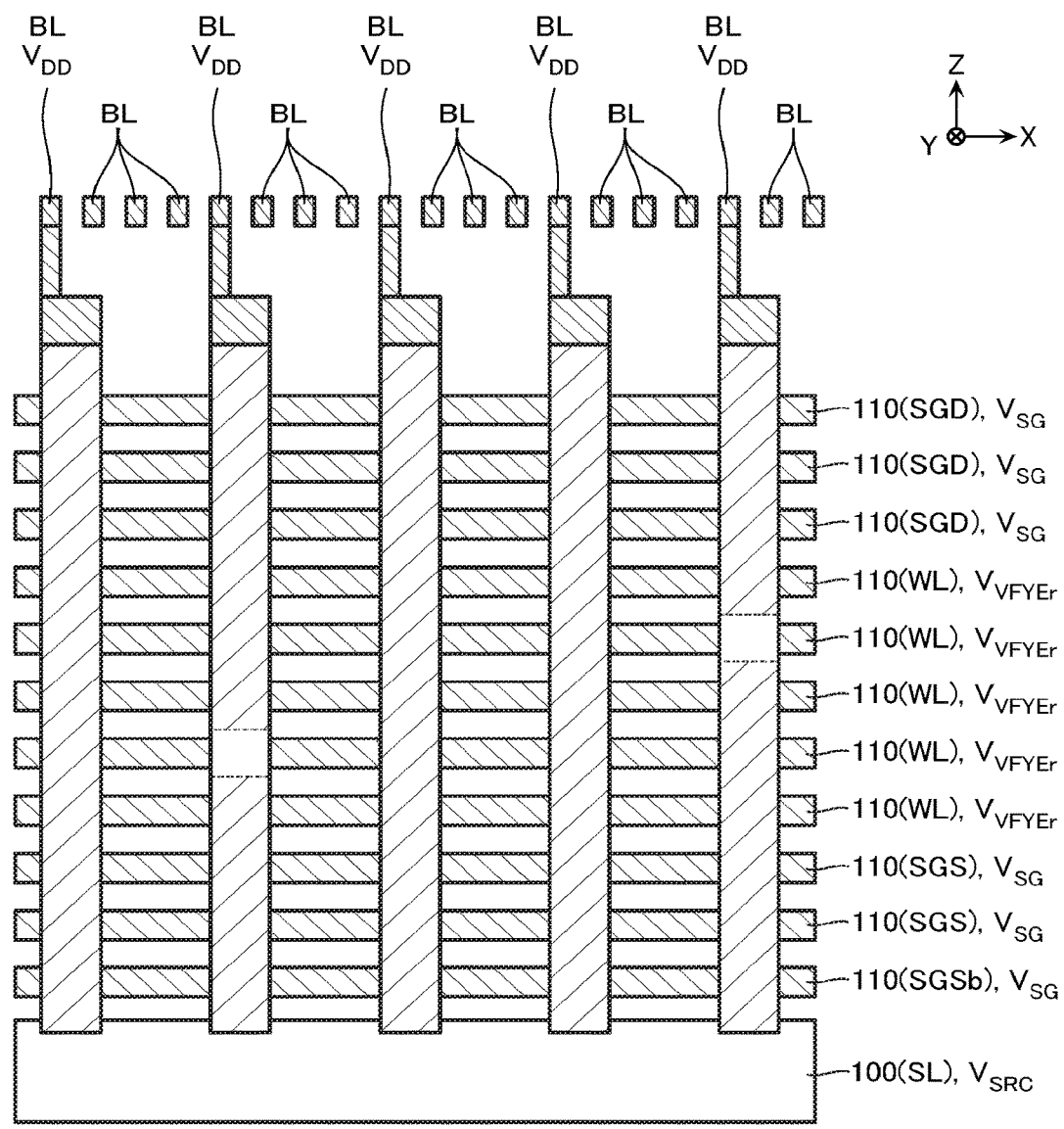
FIG. 22 is a schematic cross-sectional view for describing a verify operation included in the erase operation.
Figure 23:
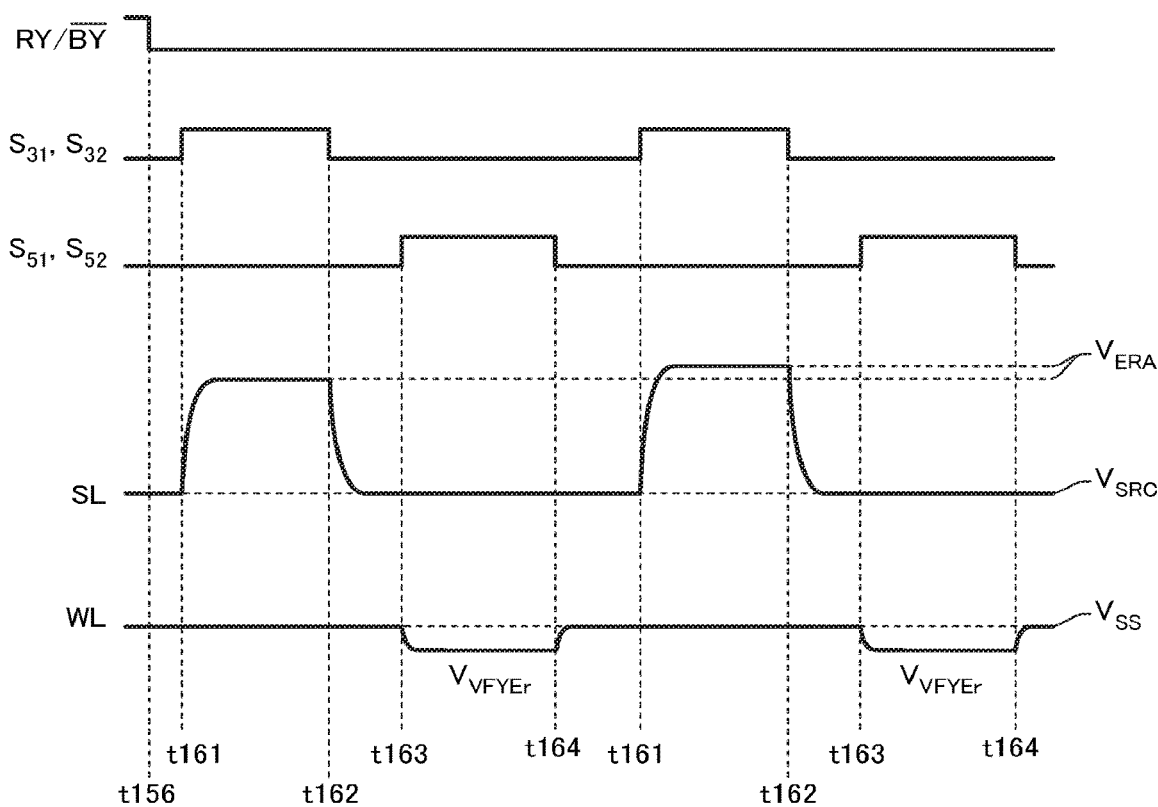
FIG. 23 is a timing chart for describing the erase operation.

FIG. 20 is a flowchart for describing the erase operation. FIG. 21 is a schematic cross-sectional view for describing an erase voltage supply operation included in the erase operation. FIG. 22 is a schematic cross-sectional view for describing an erase verify operation included in the erase operation. FIG. 23 is a timing chart for describing the erase operation.

Note that, the following description describes an example where the erase operation is executed on the memory block BLK as an object of operation.

At timing t156 of the erase operation, for example, as illustrated in FIG. 23, the voltage of the terminal RY//BY enters the "L" state.

At Step S201, for example, as illustrated in FIG. 20, a loop count $n_E$ is set to 1. The loop count $n_E$ is a variable indicative of the number of erase loops. This operation is, for example, executed at timing t156 in FIG. 23.

At Step S202, the erase voltage supply operation is executed. The erase voltage supply operation is an operation that applies the ground voltage $V_{SS}$ to the word line WL and applies the erase voltage $V_{ERA}$ to at least one of the source line SL and the bit line BL to decrease the threshold voltage of the memory cell MC. This operation is, for example, executed from timing t161 to timing t162 in FIG. 23.

At timing t161 of the erase voltage supply operation, for example, the ground voltage $V_{SS}$ is applied to the word line WL. A voltage $V_{SG}'$ is applied to the drain-side select gate line SGD and a voltage $V_{SG}''$ is applied to the source-side select gate line SGS. The voltage $V_{SG}'$ has a magnitude enough to cause the drain-side select transistor STD to be in the OFF state. The voltage $V_{SG}''$ has a magnitude enough to form a hole channel in the channel region of the source-side select transistor STS, thereby causing the source-side select transistor STS to be in the ON state.

At timing t161 of the erase voltage supply operation, the erase voltage $V_{ERA}$ is applied to the source line SL. The erase voltage $V_{ERA}$ is larger than the write pass voltage $V_{PASS}$. The erase voltage $V_{ERA}$ may have, for example, a magnitude approximately as same as the program voltage $V_{PGM}$ or may be larger than the program voltage $V_{PGM}$.

Here, for example, as illustrated in FIG. 21, the ground voltage $V_{SS}$ is applied to the word line WL and the erase voltage $V_{ERA}$ is applied to the channel of the semiconductor column 120 via the source line SL. Therefore, a relatively large electric field is generated between the semiconductor column 120 and the word line WL. This causes the electrons in the electric charge accumulating film 132 (FIG. 12) to tunnel into the channel of the semiconductor column 120 via the tunnel insulating film 131 (FIG. 12). This decreases the threshold voltage of the memory cell MC.

Note that, at timing t161, the voltages of the signal lines $S_{31}$, $S_{32}$ rise from the "L" state to the "H" state. In association with this, the current path through the node 201 (FIG. 7) and the voltage supply line $L_{VG1}$ between the source line SL and the voltage generation circuit VG enters a conductive state.

At timing t162 of the erase voltage supply operation, the voltage $V_{SRC}$ is applied to the source line SL.

Note that, at timing t162, the voltages of the signal lines $S_{31}$, $S_{32}$ fall from the "H" state to the "L" state. In association with this, the current path through the node 201 (FIG. 7) and the voltage supply line $L_{VG1}$ between the source line SL and the voltage generation circuit VG enters a disconnected state.

At Step S203 (FIG. 20), the erase verify operation is executed.

At timing t163 of the erase verify operation, for example, as illustrated in FIG. 22, the erase verify voltage $V_{VFYEr}$ is applied to the word line WL. The voltage $V_{SG}$ is applied to the select gate lines (SGD, SGS, SGSb) to cause the select transistors (STD, STS, STSb) to be in the ON state.

Note that, at timing t163, the voltages of the signal lines $S_{51}$, $S_{52}$ rise from the "L" state to the "H" state. In association with this, the current path through the node 201 (FIG. 7) and the voltage supply line $L_{VG3}$ between the word line WL and the voltage generation circuit VG enters a conductive state.

At timing t163, for example, charging of the bit lines BL is executed. At this time, for example, the voltage $V_{DD}$ is applied to at least a part of the bit lines BL. The voltage $V_{SRC}$ may be applied to a part of the bit lines BL.

From timing t163 to timing t164 of the erase verify operation, the sense operation is executed to obtain data indicative of the state of the memory cell MC.

At timing t164 of the erase verify operation, the ground voltage $V_{SS}$ is applied to the word line WL and the select gate lines (SGD, SGS, SGSb).

Note that, at timing t164, the voltages of the signal lines $S_{51}$, $S_{52}$ fall from the "H" state to the "L" state. In association with this, the current path through the node 201 (FIG. 7) and the voltage supply line $L_{VG3}$ between the word line WL and the voltage generation circuit VG enters a disconnected state.

Afterwards, the obtained data is transferred to the counter circuit (not illustrated). The counter circuit counts the number of the memory cells MC whose threshold voltages have reached the target value or the number of the memory cells MC whose threshold voltages have not reached the target value.

At Step S204 (FIG. 20), the result of the erase verify operation is determined. For example, with reference to the above-described counter circuit, for example, when the number of the memory cells MC whose threshold voltages have not reached the target value is a certain number or more, it is determined to be verify FAIL and the procedure proceeds to Step S205. On the other hand, for example, when the number of the memory cells MC whose threshold voltages have not reached the target value is a certain number or less, it is determined to be verify PASS and the procedure proceeds to Step S207.

At Step S205, whether the loop count $n_E$ has reached the predetermined number $N_E$ or not is determined. When it has not reached the predetermined number $N_E$, the procedure proceeds to Step S206. When it has reached the predetermined number $N_E$, the procedure proceeds to Step S208.

At Step S206, 1 is added to the loop count $n_E$, and the procedure proceeds to Step S202. At Step S206, for example, a predetermined voltage ΔV is added to the erase voltage $V_{ERA}$. Therefore, the erase voltage $V_{ERA}$ increases together with the increase of the loop count $n_E$.

At Step S207, status data of successful completion of the erase operation is stored in the status register STR (FIG. 4) and the erase operation is terminated. Note that, the status data is output to the controller die CD (FIG. 1) by the status read operation.

At Step S208, status data of unsuccessful completion of the erase operation is stored in the status register STR (FIG. 4) and the erase operation is terminated.

COMPARATIVE EXAMPLE

Figure 24:
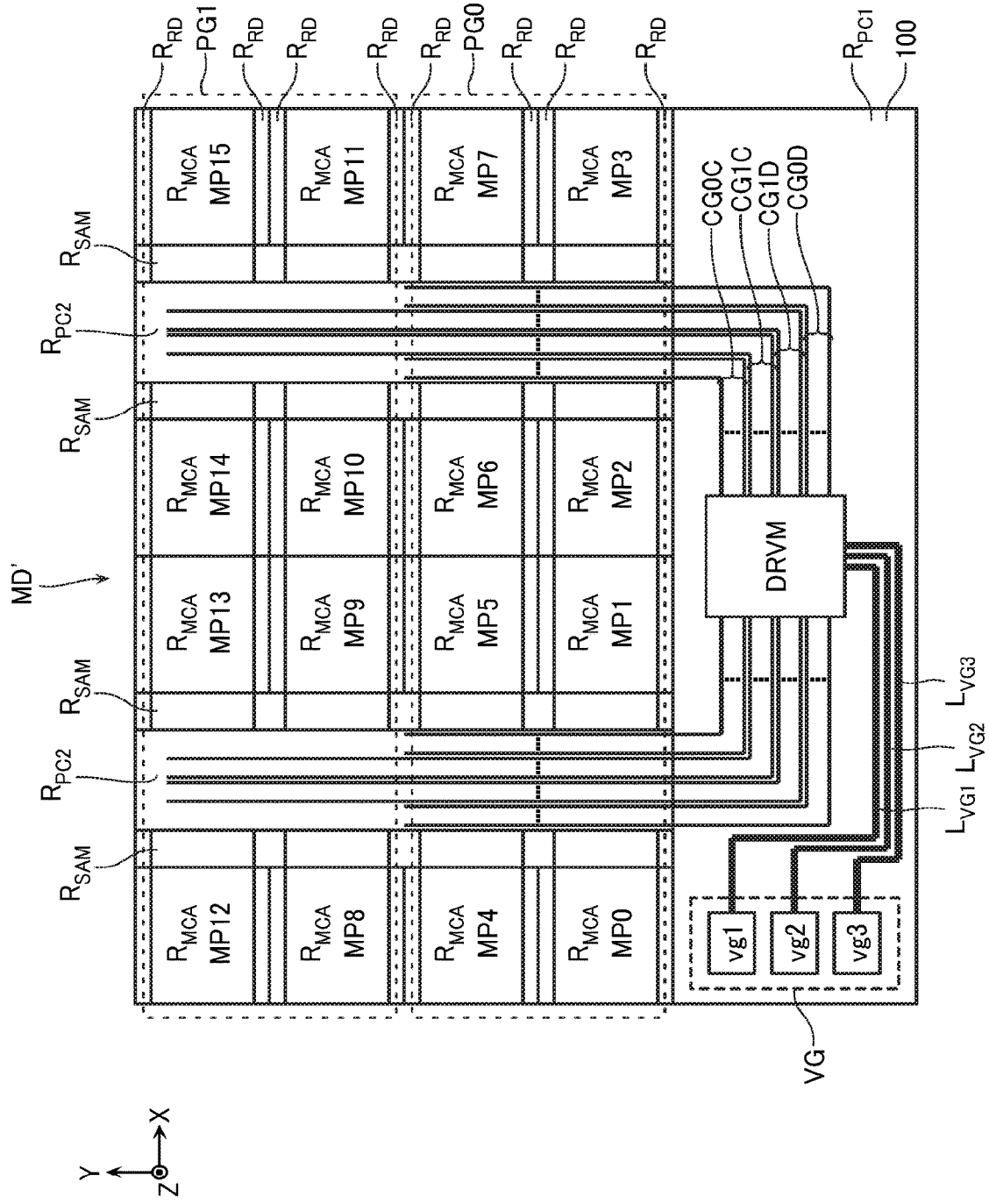
FIG. 24 is a schematic plan view of a memory die MD' according to a comparative example.
Figure 25:
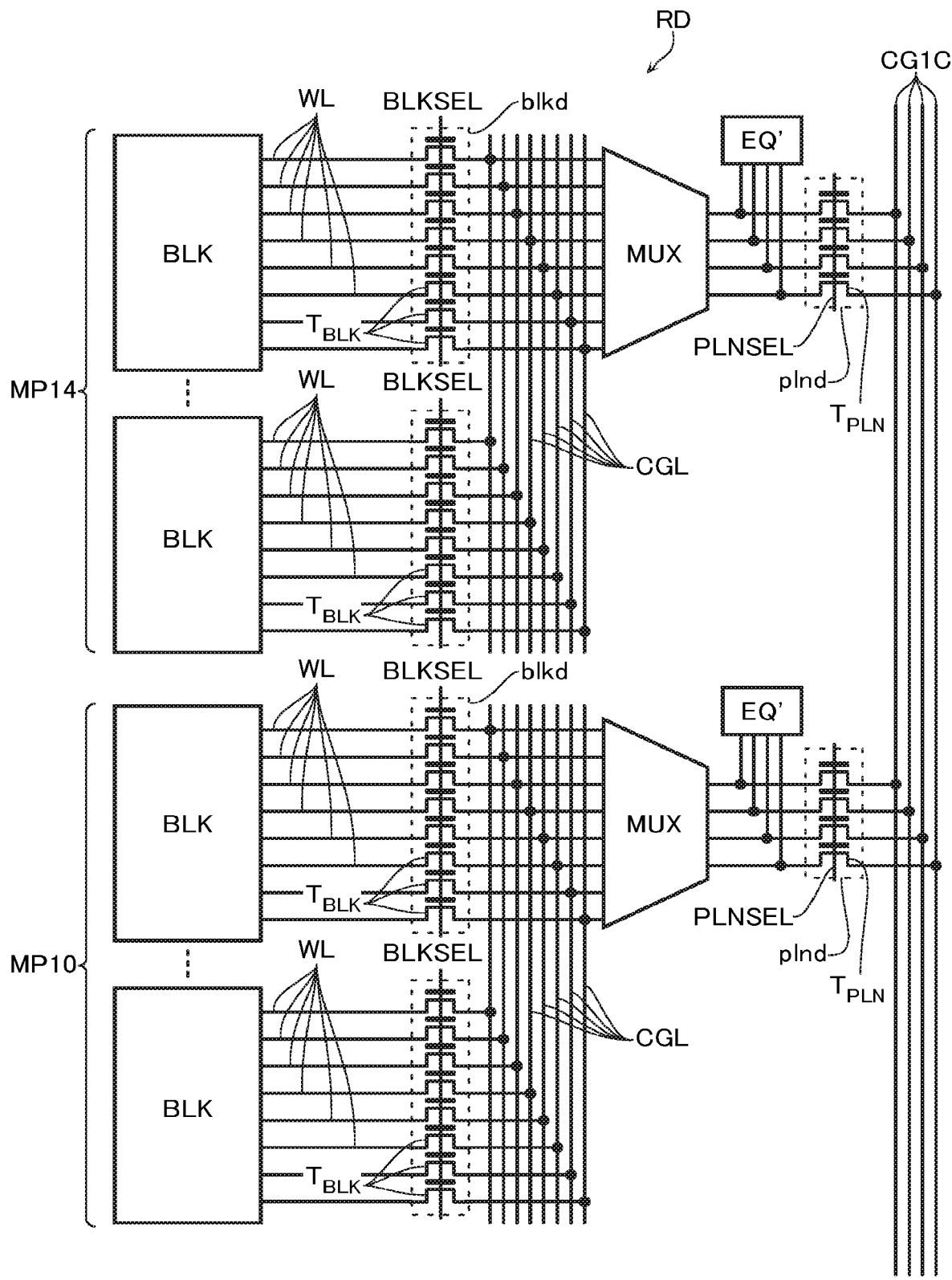
FIG. 25 is a schematic circuit diagram illustrating a configuration of a part of the memory die MD'.
Figure 26:
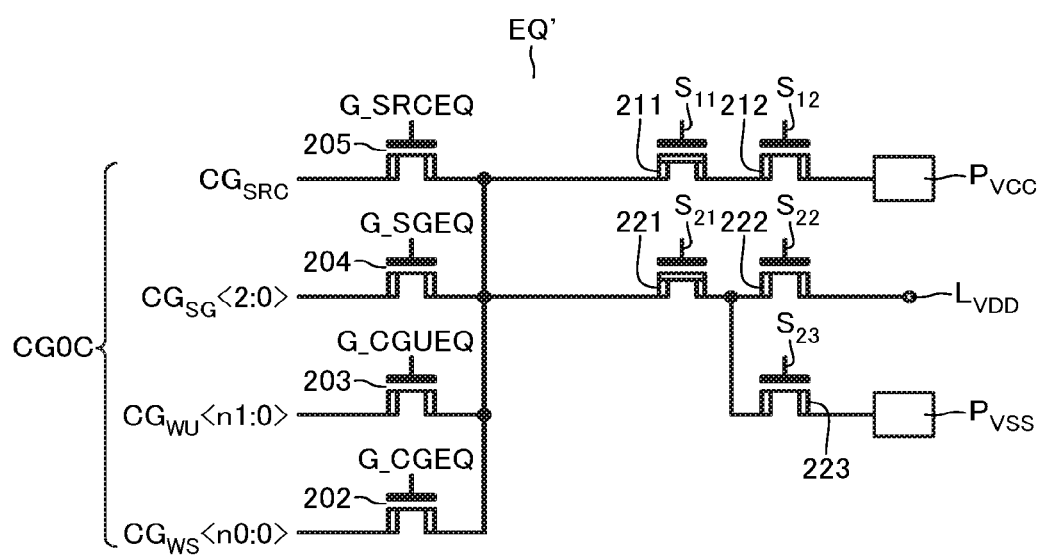
FIG. 26 is a schematic circuit diagram illustrating a configuration of a part of the memory die MD'.

Next, with reference to FIG. 24 to FIG. 26, a semiconductor memory device according to a comparative example will be described. FIG. 24 is a schematic plan view of a memory die MD' according to the comparative example. FIG. 25 and FIG. 26 are schematic circuit diagrams illustrating configurations of parts of the memory die MD'. As illustrated in FIG. 24, in the memory die MD', the voltage supply lines $L_{VG1}$, $L_{VG2}$, $L_{VG3}$ are disposed only in a range of the peripheral circuit region $R_{PC1}$, and are not disposed in the peripheral circuit region $R_{PC2}$.

As exemplarily illustrated in FIG. 25, the memory die MD' includes an equalizer EQ', not the equalizer EQ. The equalizer EQ' is not disposed in the current path between the word line WL and the voltage generation circuit VG.

As exemplarily illustrated in FIG. 26, the equalizer EQ' does not include the transistors 224, 225, 231, 232, 241, 242, 251, 252 as described with reference to FIG. 7.

In a read operation of the memory die MD', the read voltage $V_{CRG}$ is applied to the selected word line $WL_S$ via a current path including the wiring CG and the driver module DRVM.

In a program operation of the memory die MD', the program voltage $V_{PGM}$ is applied to the selected word line $WL_S$ via the current path including the wiring CG and the driver module DRVM.

In a verify operation of the memory die MD', the verify voltage $V_{VFY}$ is applied to the selected word line $WL_S$ via the current path including the wiring CG and the driver module DRVM.

[Operating Speed]

exemplarily illustrated in FIG. 24, the memory die MD' includes 16 memory cell arrays MCA corresponding to 16 memory cell array regions $R_{MCA}$. In the example in FIG. 24, the memory plane MP2 is disposed at a position relatively close to the driver module DRVM. Therefore, the wiring resistance in the wiring CG between the memory plane MP2 and the driver module DRVM is relatively small. On the other hand, the memory plane MP15 is disposed at a position relatively far from the driver module DRVM. Therefore, the wiring resistance in the wiring CG between the memory plane MP15 and the driver module DRVM is relatively large.

Here, for example, when the read operation, the program operation, the verify operation, the erase voltage supply operation, or the erase verify operation (hereinafter referred to as the "read operation or the like") is executed on the memory plane MP2, a time period that takes from a start of supplying the read voltage $V_{CGR}$, the verify voltage $V_{VFY}$, the program voltage $V_{PGM}$, the erase voltage $V_{ERA}$, or the erase verify voltage $V_{VFYEr}$ (hereinafter referred to as the "read voltage $V_{CGR}$ or the like") to the selected word line $WL_S$, the word line WL, or the source line SL (hereinafter referred to as the "selected word line $WL_S$ or the like") till the voltage of the selected word line $WL_S$ or the like converges to the read voltage $V_{CGR}$ or the like is relatively short. On the other hand, when the read operation or the like is executed on the memory plane MP15, a time period that takes from the start of supplying the read voltage $V_{CDR}$ or the like to the selected word line $WL_S$ or the like till the voltage of the selected word line $WL_S$ or the like converges to the read voltage $V_{CGR}$ or the like is relatively long .

In the memory die MD', there is a case where the read operation or the like is simultaneously or concurrently executed on the plurality of memory planes MP. Here, for example, when the read operation or the like is executed on one memory plane MP, the current that flows to the wiring CG is relatively small, and thus, the magnitude of voltage drop in the wiring CG is relatively small. Therefore, the time period that takes from the start of supplying the read voltage $V_{CGR}$ or the like to the selected word line $WL_S$ or the like till the voltage of the selected word line $WL_S$ or the like converges to the read voltage $V_{CGR}$ or the like is relatively short . On the other hand, when the read operation or the like is executed on the plurality of memory planes MP, the current that flows to the wiring CG is relatively large, and thus, the magnitude of voltage drop in the wiring CG is relatively large. Therefore, the time period that takes from the start of supplying the read voltage $V_{CGR}$ or the like to the selected word line $WL_S$ or the like till the voltage of the selected word line $WL_S$ or the like converges to the read voltage $V_{CGR}$ or the like is relatively long .

Here, in order to preferably execute the read operation or the like irrespective of the position and the number of the selected memory planes MP, it is possible to adjust conditions, such as timing in the read operation or the like, to the slowest conditions. However, in such a case, it is difficult to speed-up the operation in some cases.

Here, in the memory die MD according to the first embodiment, as described with reference to FIG. 9, the equalizer regions $R_{EQ}$ are disposed at the positions adjacent in the X-direction to the respective memory cell array regions $R_{MCA}$ of the peripheral circuit region $R_{PC2}$. The voltage supply lines $L_{VG1}$, $L_{VG2}$, $L_{VG3}$ reach the respective equalizer regions $R_{EQ}$ and are electrically connected to the memory cell arrays MCA disposed in the respective memory cell array regions $R_{MCA}$ via the equalizers EQ in the respective equalizer regions $R_{EQ}$.

Here, as described above, the wiring resistance of the voltage supply lines $L_{VG1}$, $L_{VG2}$, $L_{VG3}$ is sufficiently small compared with the wiring resistance of the wiring CG. Therefore, the wiring resistance of the current path including the equalizer EQ between the memory plane MP and the voltage generation circuit VG is sufficiently smaller than the wiring resistance of the current path including the wiring CG and the driver module DRVM. Therefore, by applying the voltage to the selected word line $WL_S$ or the like from the voltage generation circuit VG via the current path including the equalizer EQ, the difference in operating speed caused by the difference of the position and the number of the selected memory planes MP can be decreased. This allows to provide the semiconductor memory device that operates at high speed.

[Operational Failure in Association with Generation of Leakage Current]

As described above, in the memory die MD' , there is a case where the read operation or the like is simultaneously or concurrently executed on the plurality of memory planes MP. Here, when a bad block is included in the plurality of memory blocks BLK selected as objects of the read operation or the like, there is a case where the operation on the normal memory block BLK fails to be normally executed. For example, when two word lines WL adjacent in the Z-direction are short-circuited and one of them is the selected word line $WL_S$, there is a case where the voltage of the selected word line $WL_S$ fails to be preferably controlled. In such a case, there is a case where the voltage of the wiring CG corresponding to the selected word line $WL_S$ varies, and thus, the voltage of the selected word line $WL_S$ corresponding to the other memory plane MP also fails to be preferably controlled.

Here, as described above, the wiring resistance of the voltage supply lines $L_{VG1}$, $L_{VG2}$, $L_{VG3}$ is sufficiently small compared with the wiring resistance of the wiring CG. Therefore, even when the bad block as described above is included in the plurality of memory blocks BLK selected as the objects of the read operation or the like, the voltage variation as described above hardly occurs in the voltage supply lines $L_{VG1}$, $L_{VG2}$, $L_{VG3}$. Therefore, the effect on the normal block in association with the generation of the leakage current as described above can be preferably reduced.

[Other Operation Methods]

The operation methods described with reference to FIG. 14 to FIG. 23 are merely an example, and a specific execution method for the read operation or the like is appropriately adjustable. The following exemplarily describes other execution methods of the read operation with reference to FIG. 27 to FIG. 29.

Figure 27:
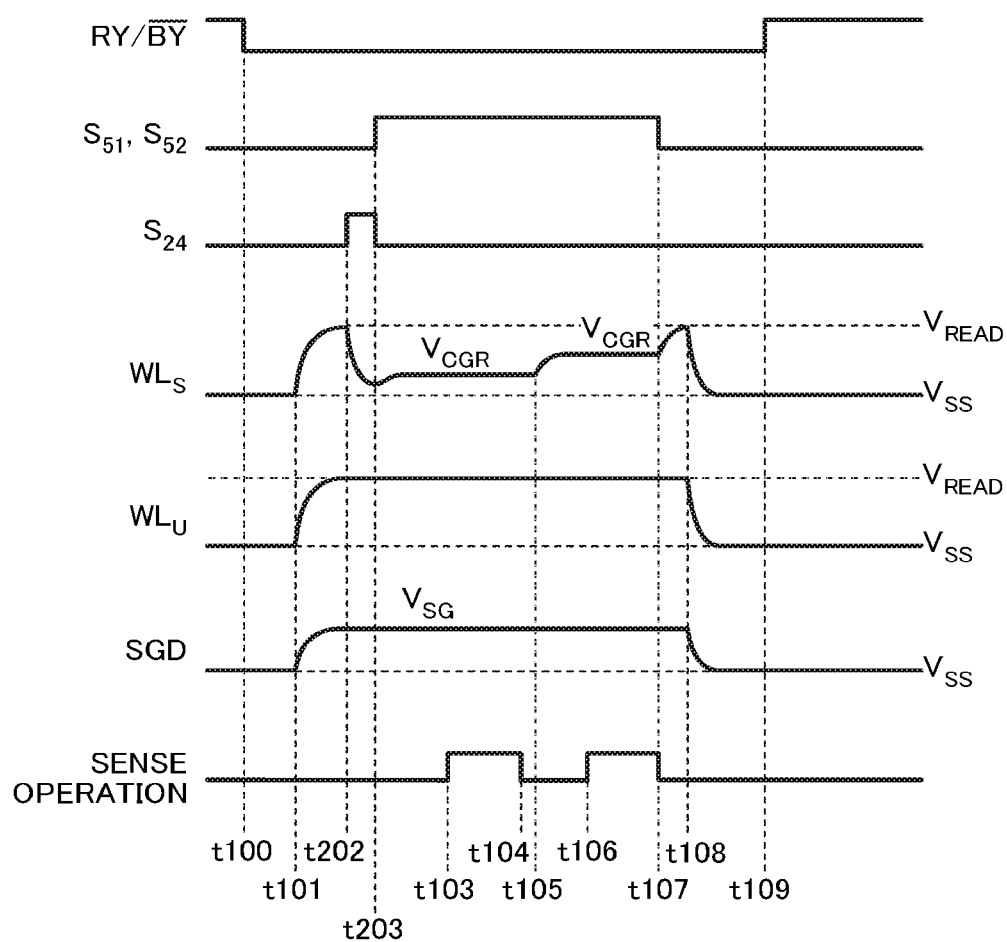
FIG. 27 is a schematic timing chart for describing another read operation.

The read operation exemplarily illustrated in FIG. 27 is basically executed similarly to the read operation described with reference to FIG. 15.

However, in the example in FIG. 15, the voltages of the signal lines $S_{51}$, $S_{52}$ rise from the "L" state to the "H" state at timing t102, thereby electrically conducting the selected word line $WL_S$ with the voltage supply line $L_{VG3}$.

On the other hand, in the example in FIG. 27, the voltage of the signal line $S_{24}$ rises from the "L" state to the "H" state at timing t202, thereby electrically conducting the selected word line $WL_S$ with the pad electrode $P_{VSS}$.

At timing t203, the voltage of the signal line $S_{24}$ falls from the "H" state to the "L" state, thereby electrically disconnecting the selected word line $WL_S$ from the pad electrode $P_{VSS}$.

At timing t203, the voltages of the signal lines $S_{51}$, $S_{52}$ rise from the "L" state to the "H" state, thereby electrically conducting the selected word line $WL_S$ with the voltage supply line $L_{VG3}$.

Figure 28:
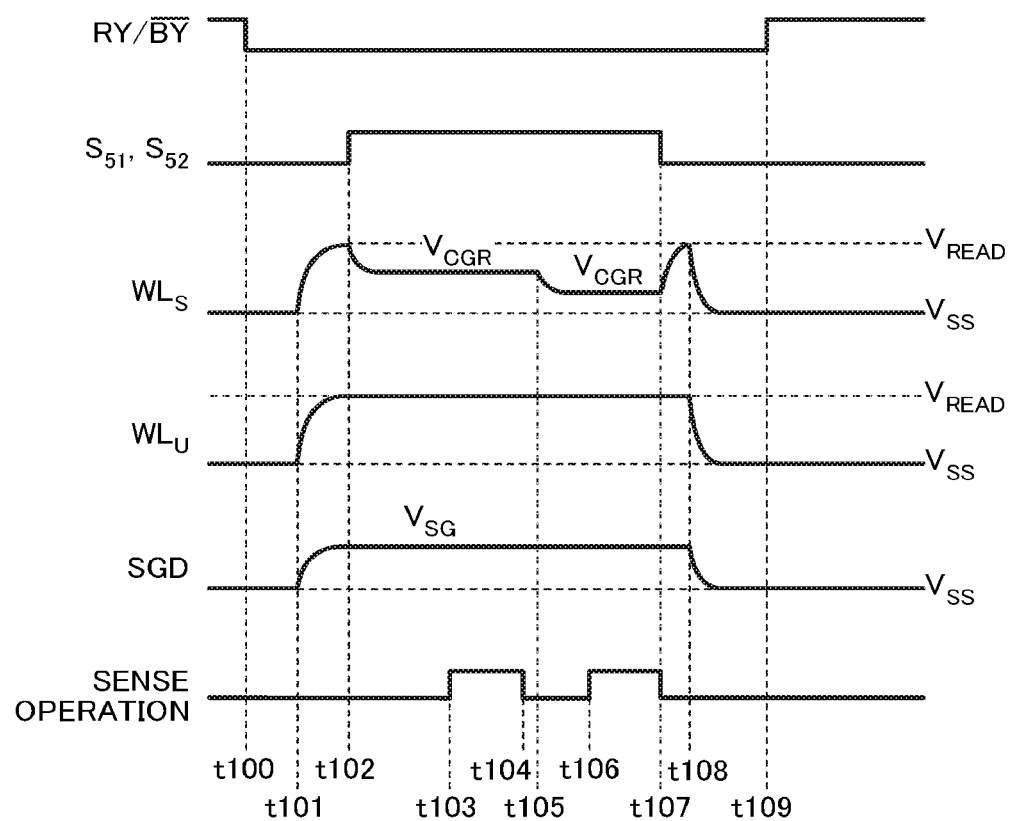
FIG. 28 is a schematic timing chart for describing another read operation.

The read operation exemplarily illustrated in FIG. 28 is basically executed similarly to the read operation described with reference to FIG. 15.

However, in the example in FIG. 15, in the read operation, the plurality of read voltages $V_{CGR}$ are applied to the selected word line $WL_S$ in the ascending order. On the other hand, in the example in FIG. 28, the plurality of read voltages $V_{CGR}$ are applied to the selected word line $WL_S$ in the descending order.

Figure 29:
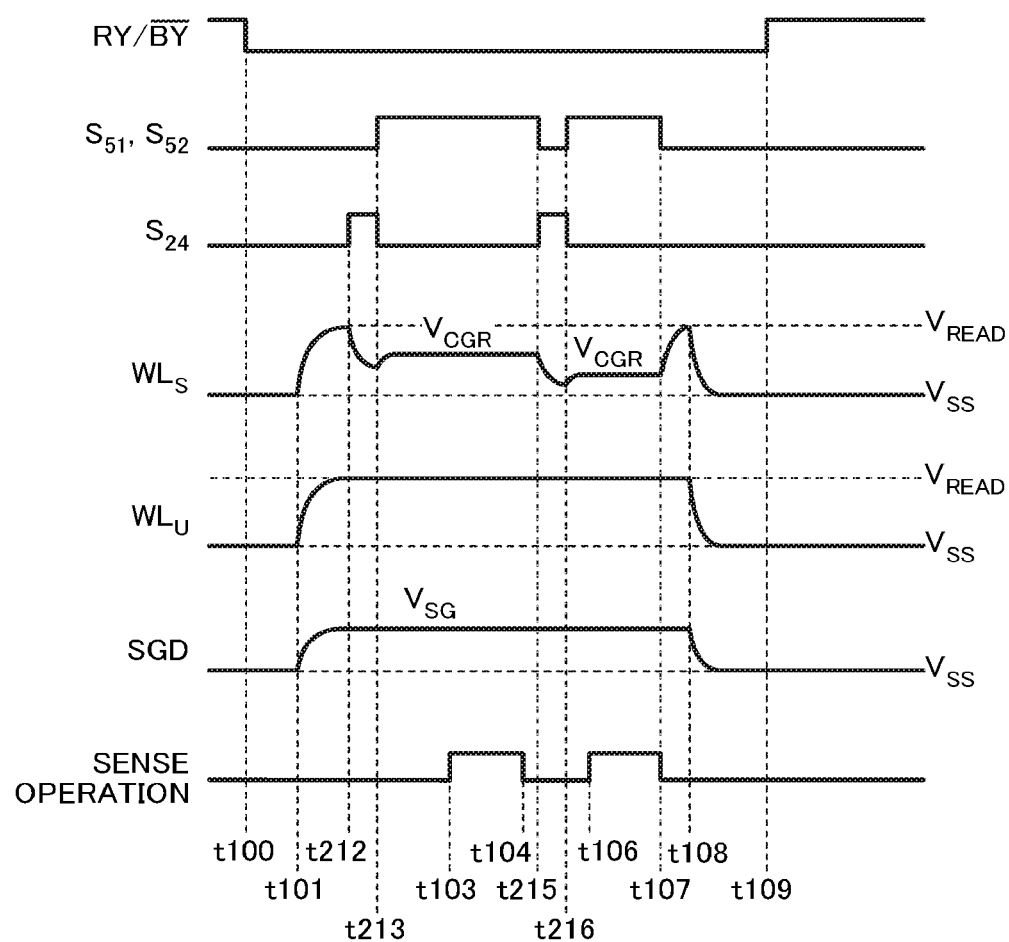
FIG. 29 is a schematic timing chart for describing another read operation.

The read operation exemplarily illustrated in FIG. 29 is basically executed similarly to the read operation described with reference to FIG. 28.

However, in the example in FIG. 28, at timing t102, the voltages of the signal lines $S_{51}$, $S_{52}$ rise from the "L" state to the "H" state, thereby electrically conducting the selected word line $WL_S$ with the voltage supply line $L_{VG3}$.

On the other hand, in the example in FIG. 29, at timing t212, the voltage of the signal line $S_{24}$ rises from the "L" state to the "H" state, thereby electrically conducting the selected word line $WL_S$ with the pad electrode $P_{VSS}$.

At timing t213, the voltage of the signal line $S_{24}$ falls from the "H" state to the "L" state, thereby electrically disconnecting the selected word line $WL_S$ from the pad electrode $P_{VSS}$.

At timing t213, the voltages of the signal lines $S_{51}$, $S_{52}$ rise from the "L" state to the "H" state, thereby electrically conducting the selected word line $WL_S$ with the voltage supply line $L_{VG3}$.

In the example in FIG. 28, the voltages of the signal lines $S_{51}$, $S_{52}$ are maintained in the "H" state at timing t105 to switch the voltage applied to the voltage supply line $L_{VG3}$.

On the other hand, in the example in FIG. 29, at timing t215, the voltages of the signal lines $S_{51}$, $S_{52}$ fall from the "H" state to the "L" state, thereby electrically disconnecting the selected word line $WL_S$ from the voltage supply line $L_{VG3}$.

At timing t215, the voltage of the signal line $S_{24}$ rises from the "L" state to the "H" state, thereby electrically conducting the selected word line $WL_S$ with the pad electrode $P_{VSS}$.

At timing t216, the voltage of the signal line $S_{24}$ falls from the "H" state to the "L" state, thereby electrically disconnecting the selected word line $WL_S$ from the pad electrode $P_{VSS}$.

At timing t216, the voltages of the signal lines $S_{51}$, $S_{52}$ rise from the "L" state to the "H" state, thereby electrically conducting the selected word line $WL_S$ with the voltage supply line $T_{VG3}$.

In the examples in FIG. 27 and FIG. 29, the selected word line $WL_S$ is once electrically conducted with the pad electrode $P_{VSS}$ when the selected word line $WL_S$ is discharged. With this, it is possible to converge the voltage of the selected word line $WL_S$ to a desired voltage at a higher speed in some cases.

Here, for example, when such an operation is executed in the memory die MD', the discharging of the selected word line $WL_S$ is executed via the wiring CG and the driver module DRVM. In such an operation, the effect of the wiring resistance in the wiring CG varies a time length that takes for discharging according to the position and the number of the selected memory planes MP in some cases. When this is reduced, the speed-up of the operation may be difficult.

Here, in the examples in FIG. 27 and FIG. 29, the discharging of the selected word line $WL_S$ is executed via the equalizer EQ. With such a method, regardless of the position and the number of the selected memory planes MP, the voltage of the selected word line $WL_S$ can be converged to the desired voltage at a high speed.

Note that, in the examples in FIG. 27 and FIG. 29, the selected word line $WL_S$ is discharged via the current path 227 exemplarily illustrated in FIG. 7. At this time, adjusting the voltage of a signal line $S_{REF}$ can preferably adjust the speed of discharging.

Note that, the operations as exemplarily illustrated in FIG. 27 to FIG. 29 are applicable not only to the read operation but also to the verify operation and the erase verify operation. The current path 227 may be used in the program operation, the verify operation, the erase voltage supply operation, or the erase verify operation.

The above description has described the example where, in the read operation and the write operation, charging and discharging are executed via the equalizer EQ when the read voltage $V_{CGR}$ or the like is applied to the selected word line $WL_S$. However, for example, charging and discharging may be executed via the equalizer EQ when the read pass voltage $V_{READ}$, the write pass voltage $V_{PASS}$, or the ground voltage $V_{SS}$ is applied to the unselected word line $WL_U$.

Other Embodiments

The semiconductor memory device according to the first embodiment has been described above. However, the semiconductor memory devices according to these embodiments are merely examples, and the specific configuration, operation, and the like are adjustable as necessary.

For example, in the example in FIG. 4, the memory die MD includes two plane groups PG0, PG1. The two plane groups PG0, PG1 each include eight memory planes MP. However, the number of the plane groups disposed in the memory die MD is adjustable as necessary. The number of the memory planes MP included in the plane group is adjustable as necessary.

In the example in FIG. 4, as the wiring CG, eight kinds of wirings CG0A, CG1A, CG0B, CG1B, CG0C, CG1C, CG0D, CG1D are disposed. The wirings CG0A, CG1A, CG0B, CG1B, CG0C, CG1C, CG0D, CG1D are each connected to two memory planes MP. However, the number of the kinds of the wiring CG is adjustable as necessary. The number of the memory planes MP connected to the wiring CG is adjustable as necessary.

In the example in FIG. 7, the equalizer EQ is used as a circuit for connecting the respective memory planes MP to the voltage supply lines $L_{VG1}$, $L_{VG2}$, $L_{VG3}$ without passing through the wiring CG or the driver module DRVM. However, such a circuit can be disposed separately from the equalizer EQ.

In the example in FIG. 9, the equalizer regions $R_{EQ}$ are adjacent to the respective memory cell array regions $R_{MCA}$ in the X-direction. However, the equalizer regions $R_{EQ}$ do not necessarily be adjacent to the respective memory cell array regions $R_{MCA}$ in the X-direction.

Figure 30:
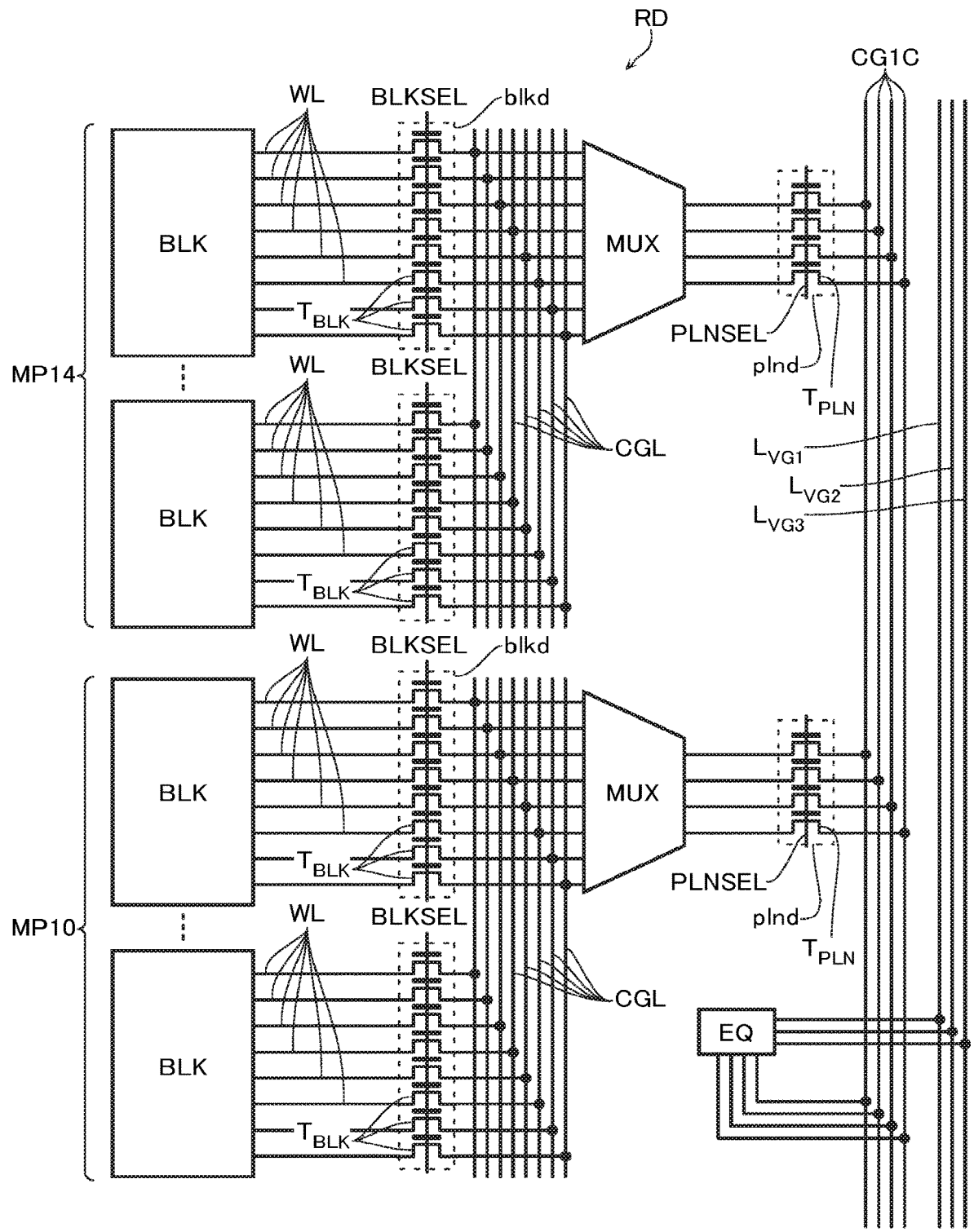
FIG. 30 is a schematic circuit diagram illustrating a configuration of a part of a memory die MD according to another embodiment.

Regardless of whether the equalizer EQ is used or not, the number of such circuits may be as same as the number of the memory planes MP or may be less than the number of the memory planes MP. For example, such circuits may be disposed corresponding to two or more memory planes MP arranged in the X-direction or the Y-direction and be shared by these two or more memory planes MP. Such circuits may be disposed corresponding to four or more memory planes MP arranged in the X-direction and the Y-direction and be shared by these four or more memory planes MP. For example, in the example in FIG. 6, the number of the equalizers EQ is as same as the number of the memory planes MP. Therefore, for example, as in FIG. 4, when 16 memory planes MP are disposed in the memory die MD, 16 equalizers EQ are disposed in the memory die MD. On the other hand, in the example in FIG. 30, the number of the equalizers EQ is as same as the number of the wirings CG. For example, as in FIG. 4, when eight kinds of the wirings CG0A, CG1A, CG0B, CG1B, CG0C, CG1C, CG0D, CG1D are disposed in the memory die MD, eight equalizers EQ are disposed in the memory die MD. In this case, the equalizer EQ is disposed corresponding to two memory planes MP arranged in the Y-direction and shared by these two memory planes MP.

In the example in FIG. 7, the node 201 is electrically connected to all the voltage supply lines $L_{VG1}$, $L_{VG2}$, $L_{VG3}$. However, the node 201 is only necessary to be connected to at least one of the voltage supply lines $L_{VG1}$, $L_{VG2}$, $L_{VG3}$. The node 201 may be connected to a voltage supply line other than the voltage supply lines $L_{VG1}$, $L_{VG2}$, $L_{VG3}$.

The arrangement, the configuration, and the like as exemplarily illustrated in FIG. 8 to FIG. 12 are merely an example, and the specific arrangement and the like are adjustable as necessary. For example, in the example in FIG. 11, the lower ends of the plurality of semiconductor columns 120 are connected to the semiconductor substrate 100 via the semiconductor layers 122. However, between the semiconductor column 120 and the semiconductor substrate 100, a semiconductor layer functioning as the source line SL (FIG. 5) may be additionally disposed. In such a case, between such a semiconductor layer and the semiconductor substrate 100, a wiring and the like may be disposed. For example, the memory module MM and the peripheral circuit PC may be formed to be different chips and these two chips may be bonded to form one memory die.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a plurality of first word lines;
    a plurality of memory cell arrays electrically connected to the plurality of first word lines;
    a first wiring electrically connected to the plurality of first word lines corresponding to the plurality of memory cell arrays;
    a driver circuit electrically connected to the first wiring;
    a plurality of second wirings electrically connected to the first wiring via the driver circuit;
    a voltage generation circuit including a plurality of output terminals disposed corresponding to the plurality of second wirings; and
    a plurality of first circuits disposed corresponding to the plurality of memory cell arrays, wherein
    the voltage generation circuit is:
        electrically connected to the plurality of first word lines via a first current path including the plurality of second wirings, the driver circuit, and the first wiring; and
        electrically connected to the plurality of first word lines via a second current path including the plurality of second wirings and the plurality of first circuits and without including the driver circuit.

2. The semiconductor memory device according to claim 1, wherein
    a first memory cell array as one of the plurality of memory cell arrays includes:
        a plurality of memory cells; and
        a plurality of word lines including one of the plurality of first word lines, wherein
    the plurality of word lines are electrically connected to the plurality of second wirings via one of the plurality of first circuits.

3. The semiconductor memory device according to claim 2, wherein
    one of the plurality of first circuits includes:
        a first node electrically connected to the plurality of word lines and the plurality of second wirings;
        a plurality of first transistors disposed in a plurality of current paths between the first node and the plurality of word lines; and
        a plurality of second transistors disposed in a plurality of current paths between the first node and the plurality of second wirings.

4. The semiconductor memory device according to claim 3, further comprising
    a pad electrode to which a first power supply voltage is applied, wherein
    at least one of the plurality of first circuits includes:
        a third transistor disposed in a third current path between the first node and the pad electrode; and
        a fourth transistor and a fifth transistor disposed in a fourth current path between the first node and the pad electrode.

5. The semiconductor memory device according to claim 3, wherein
the voltage generation circuit includes:
a first voltage generation unit that outputs a first voltage;
a second voltage generation unit that outputs a second voltage smaller than the first voltage; and
a third voltage generation unit that outputs a third voltage smaller than the second voltage.

6. The semiconductor memory device according to claim 5, wherein
in a read operation, a gate electrode of the second transistor electrically connected to the third voltage generation unit among the plurality of second transistors is applied with a voltage that causes the second transistor to be in an ON state.

7. The semiconductor memory device according to claim 5, wherein
in a program operation, a gate electrode of the second transistor electrically connected to the first voltage generation unit among the plurality of second transistors is applied with a voltage that causes the second transistor to be in an ON state.

8. The semiconductor memory device according to claim 5, wherein
in a verify operation, a gate electrode of the second transistor electrically connected to the third voltage generation unit among the plurality of second transistors is applied with a voltage that causes the second transistor to be in an ON state.

9. The semiconductor memory device according to claim 5, wherein
in an erase voltage supply operation, a gate electrode of the second transistor electrically connected to the first voltage generation unit among the plurality of second transistors is applied with a voltage that causes the second transistor to be in an ON state.

10. The semiconductor memory device according to claim 5, wherein
in an erase verify operation, a gate electrode of the second transistor electrically connected to the third voltage generation unit among the plurality of second transistors is applied with a voltage that causes the second transistor to be in an ON state.

11. The semiconductor memory device according to claim 1, wherein
the plurality of first circuits are each disposed corresponding to one of the memory cell arrays.

12. The semiconductor memory device according to claim 1, wherein
the plurality of first circuits are each disposed corresponding to two or more of the memory cell arrays.

13. A semiconductor memory device comprising:
a substrate including a plurality of first regions, a second region, and a third region, the plurality of first regions being arranged in a first direction, the second region extending in the first direction, the second region being arranged with the plurality of first regions in a second direction intersecting with the first direction, the third region being arranged with the plurality of first regions and the second region in the first direction;
a first memory cell array disposed in one of the plurality of first regions, the first memory cell array including a plurality of first memory cells and a plurality of first word lines connected to the plurality of first memory cells;
a second memory cell array disposed in another of the plurality of first regions, the second memory cell array including a plurality of second memory cells and a plurality of second word lines connected to the plurality of second memory cells;
a plurality of first wirings electrically connected to the plurality of first word lines and the plurality of second word lines;
a voltage generation circuit disposed in the third region, the voltage generation circuit including a plurality of output terminals disposed corresponding to the plurality of first wirings;
a first circuit disposed in the second region, the first circuit being disposed corresponding to the first memory cell array; and
a second circuit disposed in the second region, the second circuit being disposed corresponding to the second memory cell array, wherein
the first circuit includes:
a first node electrically connected to the plurality of first word lines and the plurality of first wirings;
a plurality of first transistors disposed in a plurality of current paths between the first node and the plurality of first word lines; and
a plurality of second transistors disposed in a plurality of current paths between the first node and the plurality of first wirings, wherein
the second circuit includes:
a second node electrically connected to the plurality of second word lines and the plurality of first wirings;
a plurality of third transistors disposed in a plurality of current paths between the second node and the plurality of second word lines; and
a plurality of fourth transistors disposed in a plurality of current paths between the second node and the plurality of first wirings.

14. The semiconductor memory device according to claim 13, wherein
the first memory cell array is farther from the voltage generation circuit than the second memory cell array, and
the first circuit is farther from the voltage generation circuit than the second circuit.

15. The semiconductor memory device according to claim 13, further comprising
a pad electrode to which a first power supply voltage is applied, wherein
the first circuit includes:
a fifth transistor disposed in a third current path between the first node and the pad electrode; and
a sixth transistor and a seventh transistor disposed in a fourth current path between the first node and the pad electrode.

16. The semiconductor memory device according to claim 13, wherein
the voltage generation circuit includes:
a first voltage generation unit that outputs a first voltage;
a second voltage generation unit that outputs a second voltage smaller than the first voltage; and
a third voltage generation unit that outputs a third voltage smaller than the second voltage.

17. The semiconductor memory device according to claim 16, wherein
in a read operation, a gate electrode of the second transistor electrically connected to the third voltage generation unit among the plurality of second transistors is applied with a voltage that causes the second transistor to be in an ON state.

18. The semiconductor memory device according to claim 16, wherein
in a program operation, a gate electrode of the second transistor electrically connected to the first voltage generation unit among the plurality of second transistors is applied with a voltage that causes the second transistor to be in an ON state.

19. The semiconductor memory device according to claim 16, wherein
in a verify operation, a gate electrode of the second transistor electrically connected to the third voltage generation unit among the plurality of second transistors is applied with a voltage that causes the second transistor to be in an ON state.

20. The semiconductor memory device according to claim 16, wherein
in an erase voltage supply operation, a gate electrode of the second transistor electrically connected to the first voltage generation unit among the plurality of second transistors is applied with a voltage that causes the second transistor to be in an ON state.

* * * * *